(12) United States Patent
Lee et al.

(10) Patent No.: US 11,493,850 B2
(45) Date of Patent: Nov. 8, 2022

(54) LITHOGRAPHY METHOD USING MULTI-SCALE SIMULATION, SEMICONDUCTOR DEVICE MANUFACTURING METHOD AND EXPOSURE EQUIPMENT

(71) Applicant: Samsung Electronics Co., Ltd., Suwon-si (KR)

(72) Inventors: Byunghoon Lee, Seoul (KR); Changyoung Jeong, Yongin-si (KR); Byunggook Kim, Seoul (KR); Maenghyo Cho, Seoul (KR); Muyoung Kim, Seoul (KR); Junghwan Moon, Seoul (KR); Sungwoo Park, Seoul (KR); Hyungwoo Lee, Seoul (KR); Joonmyung Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 461 days.

(21) Appl. No.: 16/593,149

(22) Filed: Oct. 4, 2019

(65) Prior Publication Data

US 2021/0026249 A1    Jan. 28, 2021

Related U.S. Application Data

(60) Provisional application No. 62/893,687, filed on Aug. 29, 2019.

(30) Foreign Application Priority Data

Jul. 23, 2019  (KR) ......................... 10-2019-0089212

(51) Int. Cl.
*G03F 7/20* (2006.01)
*H01L 21/027* (2006.01)
*G05B 19/4097* (2006.01)

(52) U.S. Cl.
CPC ......... *G03F 7/705* (2013.01); *G05B 19/4097* (2013.01); *H01L 21/0273* (2013.01); *G05B 2219/45028* (2013.01)

(58) Field of Classification Search
CPC .... G03F 7/705; G03F 7/0045; G03F 7/70516; G05B 19/4097; G05B 2219/45028; H01L 21/0273
See application file for complete search history.

(56) References Cited

U.S. PATENT DOCUMENTS 7,629,583 B2    12/2009  Kim et al.
7,921,383 B1 *   4/2011  Wei .......................... G03F 7/705
                                                       716/54

(Continued)

FOREIGN PATENT DOCUMENTS

KR          10-0720254 B1    5/2007
KR        10-2011-0012798 A   2/2011

(Continued)

OTHER PUBLICATIONS

Li et al., "Energy-Represented Direct Inversion in the Iterative Subspace within a Hybrid Geometry Optimization Method," J. Chem. Theory Comput., vol. 2, No. 3, pp. 835-839, 2006.

(Continued)

*Primary Examiner* — Nghia M Doan
(74) *Attorney, Agent, or Firm* — Muir Patent Law, PLLC

(57) ABSTRACT

There are provided a lithography method capable of selecting best resist and a semiconductor device manufacturing method and exposure equipment based on the lithography method. The lithography method includes estimating a shape of a virtual resist pattern based on a multi-scale simulation for resist, forming a test resist pattern by performing exposure on selected resist based on the simulation result, comparing the test resist pattern with the virtual resist pattern, and forming a resist pattern on an object to be (Continued)

patterned by using the resist when an error between the test resist pattern and the virtual resist pattern is in an allowable range.

15 Claims, 19 Drawing Sheets

(56) References Cited

U.S. PATENT DOCUMENTS

| | | | |
|---|---|---|---|
| 8,589,827 B2 | 11/2013 | Biafore et al. | |
| 9,733,576 B2 | 8/2017 | Smith et al. | |
| 10,048,594 B2 | 8/2018 | Carcasi et al. | |
| 2007/0032896 A1* | 2/2007 | Ye | G03F 7/705 716/54 |
| 2016/0012175 A1 | 1/2016 | Wu et al. | |
| 2018/0165388 A1* | 6/2018 | Liu | G03F 9/708 |

FOREIGN PATENT DOCUMENTS

| | | |
|---|---|---|
| KR | 10-2012-0077081 A | 7/2012 |
| KR | 10-2019-0033912 A | 4/2019 |

OTHER PUBLICATIONS

Lawson et al., "Mesoscale simulation of molecular resists: The effect of PAG distribution homogeneity on LER," Microelectronic Engineering 86, pp. 741-744, 2009.

Houle et al., "Kinetic Model for Positive Tone Resist Dissolution and Roughening," Macromolecules, vol. 35, No. 22, 2002.

Kim et al., "Multiscale Simulation Approach on Sub-10 nm Extreme Ultraviolet Photoresist Patterning: Insights from Nanoscale Heterogeneity of Polymer," Macromolecules 2018, 51, pp. 6922-2935, Aug. 29, 2018.

* cited by examiner

LITHOGRAPHY METHOD USING MULTI-SCALE SIMULATION, SEMICONDUCTOR DEVICE MANUFACTURING METHOD AND EXPOSURE EQUIPMENT

CROSS-REFERENCE TO RELATED APPLICATION

This application claims the benefit of priority to Korean Patent Application No. 10-2019-0089212, filed on Jul. 23, 2019 in the Korean Intellectual Property Office, and claims the benefit of priority to U.S. Provisional Application No. 62/893,687 filed Aug. 29, 2019, the disclosure of each of these applications being incorporated herein in its entirety by reference.

BACKGROUND

The inventive concept relates to a lithography method, and a semiconductor device manufacturing method and exposure equipment based on the lithography method.

Recently, as a semiconductor circuit line width is gradually refined, a light source with a shorter wavelength is being used for lithography exposure. For example, extreme ultraviolet (EUV) is being used as an exposure light source. Due to absorption characteristics of EUV, in general, in an EUV exposure process, a reflective EUV mask is often used. In addition, illumination optics for transmitting EUV to an EUV mask and projection optics for projecting EUV reflected from the EUV mask to an object to be exposed may include a plurality of mirrors. As a level of difficulty of the exposure process gradually increases, the significance of development of EUV resist used in a lithography process is increasing.

SUMMARY

The inventive concept provides a lithography method capable of optimizing resist performance and a semiconductor device manufacturing method and exposure equipment based on the lithography method.

According to an aspect of the inventive concept, there is provided a lithography method using a multi-scale simulation, including estimating a shape of a virtual resist pattern based on a multi-scale simulation for a selected resist, forming a test resist pattern by performing exposure on a layer formed of the selected resist, comparing the test resist pattern with the virtual resist pattern, and forming a device resist pattern formed of the selected resist on an object to be patterned when an error between the test resist pattern and the virtual resist pattern is in an allowable range.

According to an aspect of the inventive concept, there is provided a method of manufacturing a semiconductor device, including estimating a shape of a virtual resist pattern based on a multi-scale simulation for a selected resist, forming a test resist pattern by performing exposure on a layer formed of the selected resist, comparing the test resist pattern with the virtual resist pattern, and forming a device resist pattern formed of the selected resist on an object to be patterned when an error between the test resist pattern and the virtual resist pattern is in an allowable range, forming a pattern on the object to be patterned by using the device resist pattern as an etching mask, and performing one or more subsequent semiconductor processes on the object to be patterned to form the semiconductor device.

According to an aspect of the inventive concept, there is provided exposure equipment including a simulation device configured to perform a multi-scale simulation for resist and an exposure device configured to perform an exposure process using a resist selected based on a result from the simulation device. By comparing a test resist pattern formed by the exposure device with a virtual resist pattern estimated by the simulation device, when an error between the test resist pattern and the virtual resist pattern is in an allowable range, a resist pattern is formed on an object to be patterned by using the selected resist.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
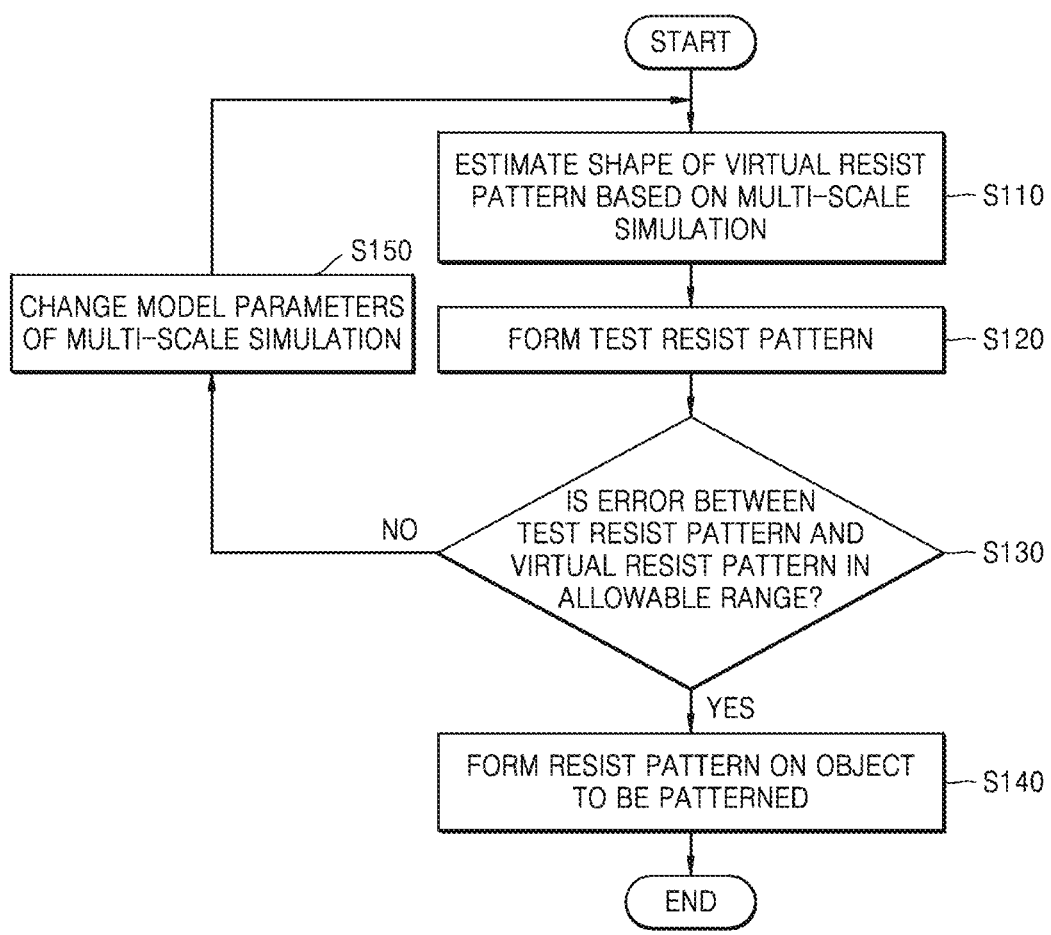
FIG. 1 is a flowchart schematically illustrating a lithography method using a multi-scale simulation according to an embodiment of the inventive concept.

FIG. 1 is a flowchart schematically illustrating a lithography method using a multi-scale simulation according to an embodiment of the inventive concept.

Referring to FIG. 1, in the lithography method using multi-scale simulation according to the current embodiment, first, a shape of a virtual resist pattern is estimated based on the multi-scale simulation in operation S110. The multi-scale simulation result is obtained by integrating simulations of different scales. For example, the multi-scale simulation may be obtained by integrating a quantum scale simulation, a molecular scale simulation, and a continuum scale simulation with each other. For example, in the multi-scale simulation, a result of the quantum scale simulation may be used for the molecular scale simulation or the continuum scale simulation, a result of the molecular scale simulation may be used for the continuum scale simulation, and a result of the continuum scale simulation may be used for the molecular scale simulation and accordingly, the simulations may be organically integrated with each other Here, the quantum scale simulation may be a simulation of a chemical reaction that accompanies a change in electronic structure. For example, the quantum scale simulation may include simulations of dissociation energy of a photo-acid generator (PAG) by a secondary electron and a reaction speed constant of deprotection of a polymer. The molecular scale simulation may be a simulation at an atomic or molecular level. For example, the molecular scale simulation may include simulations for modeling a unit lattice cell at the molecular level, modeling a combination structure between a polymer chain and the PAG in the unit lattice cell, and modeling a protection group position and an acid concentration profile.

The continuum scale simulation may model physical and chemical phenomena that accompany a continuous change in material property in time and space. For example, the continuum scale simulation may include simulations for acid diffusion and a deprotection reaction. A continuum scale simulation may model a material of which a characteristic is maintained (at a certain level) although the material is infinitely divided into small elements. In the continuum scale simulation, it may be ignored (at a certain level) that a material is not continuous, is formed of atoms, and has a non-uniform microstructure.

In the estimating of the shape of the virtual resist pattern S110, the virtual resist pattern is formed while changing model parameters for resist by using the multi-scale simulation and the shape of the corresponding virtual resist pattern may be estimated. It should be appreciated that for ease of description, reference herein to formation of a virtual resist and the processes involved in the formation of a virtual resist (e.g., dissociation, acid diffusion, deprotection, etc.) reflect simulated processes even though they may be positively expressed herein as occurring. Similarly, the reference to intermediate and final structure of the virtual resist structure is used for ease of description of the intermediate and final results (e.g., calculations) of the simulation. On the other hand, in the estimating of the shape of the virtual resist pattern S110, the simulation may be repeated until the shape of the virtual resist pattern reaches a shape of a required target resist pattern.

The estimating of the shape of the virtual resist pattern S110 will be described in more detail with reference to FIG. 3A.

The lithography method according to the inventive concept may include and/or model all kinds of lithography processes including an exposure process. For example, the lithography method according to the inventive concept may include and/or model extreme ultra-violet (EUV), ArF-Immersion, ArF, KrF, an electron beam, ion-beam, or neutron beam lithography method. Hereinafter, for convenience sake, an EUV lithography method will be mainly described.

After estimating the shape of the virtual resist pattern, in operation S120, a test resist pattern is formed by using the resist that was modeled in S110 (i.e., using a resist material having the composition of the resist of the simulation in S110). The resist may be, for example, an EUV resist and the exposure process may be performed using EUV. The resist is not limited to an EUV resist and the exposure process is not necessarily performed by using EUV. A process of forming the test resist pattern in S120 may be the same as a process of forming a device resist pattern on an object to be patterned to form a semiconductor device in S140 (although the test resist pattern may be formed on a test substrate while the device resist pattern may be formed on the object to be patterned, such as a wafer W).

After forming the test resist pattern, the test resist pattern is compared with the virtual resist pattern and it is determined whether an error (e.g., a difference therebetween) is in an allowable range in operation S130. The test resist pattern is compared with the virtual resist pattern by comparing various characteristics (e.g., sizes and shapes) with each other. For example, a critical dimension (CD), line edge roughness (LER), line width roughness (LWR), and local CD uniformity (LCDU) may be compared with each other. The allowable range may be arbitrarily set by a user considering a process error in the real lithography process. For example, an error of no more than X % (e.g., 10%) may be set as the allowable range. It will be appreciated that reference to an error in the allowable range (or other similar description) as used herein contemplates and includes the existence of no error.

When the error is in the allowable range (YES), the method proceeds to operation S140 where the resist pattern is formed on (i.e., duplicated on) the object to be patterned using the resist and the exposure process which formed the test resist pattern in S120 (resulting in an error in the allowable range). Here, the exposure process is, for example, the EUV exposure process and the object (refer to W of FIG. 12B) to be patterned may be an object on which a pattern is to be formed by using the resist pattern. For example, the object to be patterned may be a wafer W (e.g., from which a plurality of semiconductor devices (e.g., semiconductor chips or integrated circuits) are formed) or lithographic mask (i.e., photomask) for manufacturing a plurality of semiconductor devices. The pattern to be formed on the object may be a layer below the resist pattern that is selectively etched using the resist pattern as a mask (and may have the pattern of the resist pattern transferred to such layer).

The forming of the resist pattern on the object to be patterned S140 will be described in more detail with reference to FIG. 3B.

Referring back to FIG. 1, when the error deviates from (outside of) the allowable range (NO), model parameters of the multi-scale simulation are changed in operation S150. Here, the model parameters may be used for the respective simulations in the multi-scale simulation. For example, the model parameters may be equations used for the respective simulations or variables of the equations. A result value of the multi-scale simulation for the same resist material composition may vary by changing the model parameters. It should also be appreciated that changing the model parameters may result in modeling a different resist material in step S150.

After changing the model parameters, the process proceeds to the estimating of the shape of the virtual resist pattern S110 and subsequent operations are performed again based on the updated model parameters (as changed in S150).

In the lithography method according to the current embodiment, through the multi-scale simulation onto which the quantum scale, the molecular scale, and the continuum scale are integrated, physical phenomena at a multilevel such as acid activation, acid diffusion, deprotection, and a change in solubility of the polymer chain in an exposed domain may be simulated. Therefore, in the lithography method according to the current embodiment, by simulating performance of a variety of resists having different structure and/or material composition(for example, resist manufacturing or selection->exposure->post-exposure bake (PEB)->developing), development time and cost of the lithography resist may be significantly reduced. In addition, in the lithography method according to the current embodiment, by overcoming limitations of conventional single scale simulations, in comparison with the single scale simulations, consistency for estimation of a resist pattern shape may be significantly improved.

For reference, an interpretation method, in which the lithography process is simulated by using an individual scale simulation and the resist pattern is estimated, was suggested by Henderson and Houle (see Houle et al., "Kinetic Model for Positive Tone Resist Dissolution and Roughening," Macromolecules 2002, 35, 8591-8600 and Lawson et al., "Mesoscale Simulation of Molecular Resists: The Effect of PAG Distribution Homogeneity on LER," Microelectron. Eng. 2009, 86, 741-744). For example, in the interpretation model of Henderson based on a Kinetic Monte Carlo (KMC) simulation that is a meso scale simulation, a photoresist polymer chain is replaced by a lattice model and movements of acid molecules among the respective lattice regions are simulated by using a random walk algorithm. However, in the interpretation model of Henderson, a photochemical reaction such as exposure->PAG dissociation->acid activation may not be precisely simulated and, since an amorphous polymer chain is replaced by a cubic structure, a pattern shape of several nanometers may not be precisely estimated.

In addition, in the interpretation model of Houle based on a finite difference method (FDM) simulation that is a continuum scale simulation, after replacing photoresist by a volume element array, chemical reaction progresses in the respective elements are calculated by using an Arrhenius equation. However, the interpretation model of Houle requires preceding experimental data in order to apply a chemical reaction speed constant in the Arrhenius equation and the photochemical reaction such as the exposure->the PAG dissociation->the acid activation may not be simulated. In addition, it also significantly matters that, after the photochemical reaction, a polymer chain may not be removed by a development process and the pattern shape may not be estimated.

On the other hand, in the lithography method according to the current embodiment, by simulating the physical phenomena at the multilevel such as the acid activation, the acid diffusion, the deprotection, and the change in the solubility of the polymer chain in the exposed domain through the multi-scale simulation, the limitations of the conventional single scale simulations are overcome and accordingly, in comparison with the single scale simulations, consistency for the estimation of the resist pattern shape may be significantly improved.

Figure 2:
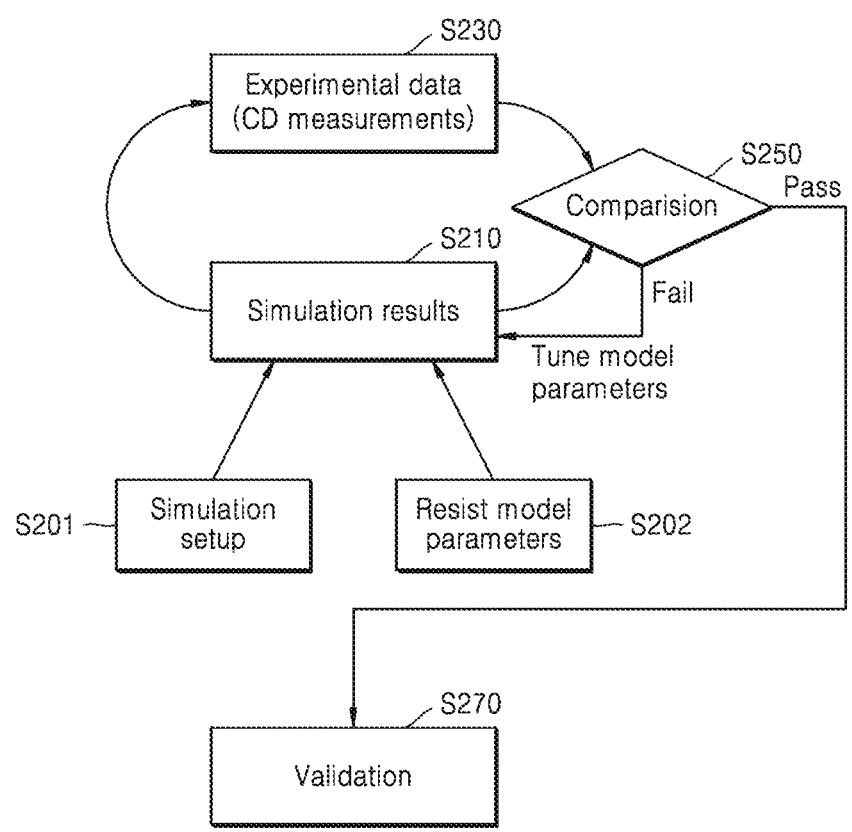
FIG. 2 is a conceptual diagram illustrating the lithography method of FIG. 1 by comparing experimental data with a simulation result.

FIG. 2 is a conceptual diagram illustrating the lithography method of FIG. 1 by comparing experimental data with a simulation result. Description previously given with reference to FIG. 1 may be omitted. For example, operations S210, S230 and S250 may correspond to operations S110, S120, and S130, respectively. Similarly, operations S201 and S202 may correspond to operation S150.

Referring to FIG. 2, in the lithography method according to the current embodiment, in operation S201, the multi-scale simulation is setup. This may include configuring a computer with software to perform the multi-scale simulation. In addition, this may include configuring a computer to perform simulations of different scales (as described herein) with an initial set of model parameters (e.g., an initial set of equations and/or variables of the equations). In addition, a resist is selected in operation 210 (selected from a plurality of different resist types having different compositions). The resist may be selected based on the result of a multi-scale simulation of a previously selected resist. Thus, operation S210 of obtaining simulation results from the multi-scale simulation integrating simulations of different scales and operation S202 of setting model parameters for resist to be used in the multi-scale simulation may have been previously performed. Selection of the resist may comprise creating (manufacturing) a resist having a composition corresponding to the result of the multi-scale simulation in operation S210 (i.e., that passes the comparison of operation S250). It should be appreciated that selection of a resist may be selection of one of several commercially available resists. In such a case, providing resist model parameters S202 may occur after selection of a resist. Alternatively, providing resist model parameters in operation S202 may correspond to a selection of a resist (which is which may be later created to obtain experimental data in operation S230).

Then, in operation S230, the resist pattern is formed by performing the exposure process by using the selected resist to obtain experimental data of the selected resist pattern. Here, the experimental data may be, for example, CD measurement values for the resist pattern and/or other characteristics of the resist pattern described herein, such other size and shape characteristics (the experimental data is not limited to the CD measurement values for the resist pattern).

Then, in operation S250, the experimental data obtained in operation S230 is compared with data of the virtual resist pattern obtained from the multi-scale simulation in operation S210. When in operation S250 it is determined that the error is in the allowable range (by comparing the experimental data with the data of the virtual resist pattern and obtaining a corresponding PASS result), it is determined that selection of the resist based on the multi-scale simulation is valid (operation S270). Here, the data on the virtual resist pattern may be similar to data on the required target resist pattern.

On the other hand, when it is determined that the error deviates from the allowable range by comparing the experimental data with the data on the virtual resist pattern (FAIL), the model parameters in the multi-scale simulation are changed, and a process of selecting the resist by using the multi-scale simulation is performed again.

For reference, since conventional resist is selected based on an experimental test (for example, resist manufacturing->exposure->PEB->developing-->scanning electron microscopy (SEM) measuring), it takes too long a development period and too high cost. In addition, in a conventional simulation method, since a large amount of random parameter is included in a portion in which resist is patterned, a simulation of a simple equation is used, and the simulation is interlocked with a semi-empirical model including an experimental SEM image, it takes a long improvement period and consistency of estimation of the shape of the resist pattern is not high.

On the other hand, in the lithography method according to the current embodiment, by using the multi-scale simulation interlocked between different scales, by optimizing a structure and concentration of a resist material (for example, the polymer chain, the PAG, quencher, or surfactant) and calculating characteristics (for example, the CD, the LER, the LWR, and the LCDU) of the resist pattern after simulating PEB and development processes, pre-screen may be performed before an experimental test and the resist developing time and cost may be minimized by securing consistency for a resist development solution and minimizing tests by integrating the experimental test with the multi-scale simulation. Furthermore, in the lithography method according to the current embodiment, based on the multi-scale simulation, since use of a random parameter is minimized and the parameter is calculated in association with the other scale parameters, reliability of a calculation result may be secured and, in addition, distortion of an SEM noise level is minimized and accordingly, consistency of a 3D pattern profile of the resist may be significantly improved.

Figure 3A:
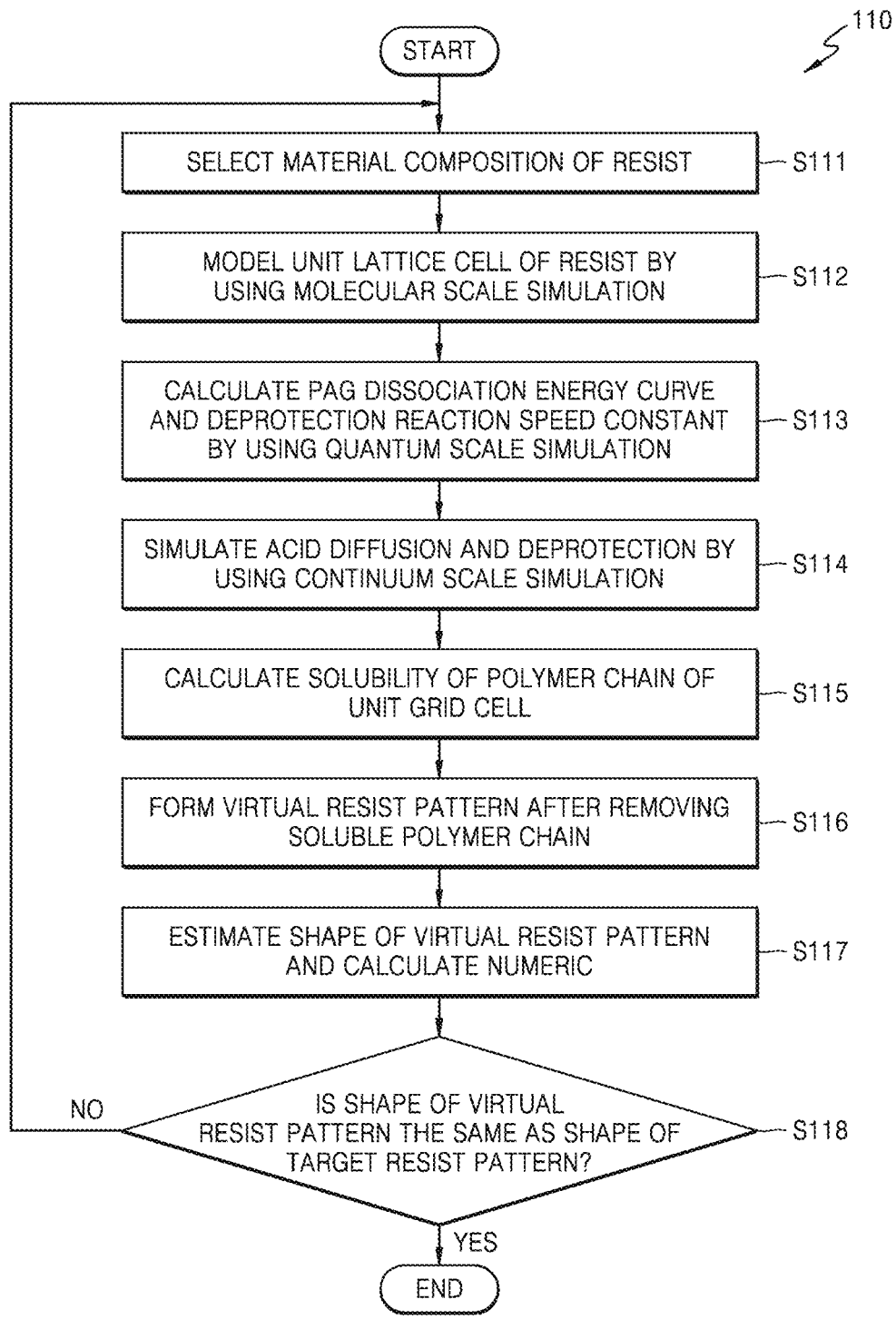
FIG. 3A illustrates a flowchart providing an example of estimating a shape of the virtual resist pattern which may be used with operations of FIGS. 1 and 2.

FIG. 3A illustrates a flowchart providing an example of estimating a shape of the virtual resist pattern, which may be used for the operation of S110 of FIG. 1 and operation S210 of FIG. 2. FIG. 3B illustrates a flowchart providing an example of forming the resist pattern, which may be used for operation S120 of FIG. 1 and operation S230 of FIG. 2. Description previously given with reference to FIGS. 1 and 2 may be omitted.

Referring to FIG. 3A, in the estimating the shape of the virtual resist pattern S110, first, a material composition of the resist to be simulated is selected in operation S111. For example, the material composition of the resist may include one or more of molecular weight of the polymer chain, a kind of the protection group of the polymer chain, a kind of PAG molecules, a mixing ratio of PAG molecules (e.g., PAG to polymer ratio), a kind of polymer, a kind of a material that is a component of the resist material other than PAG or polymers having a protection group (to be deprotected by the PAG) such as a kind of quencher and/or a kind of surfactant, and a mixing ratio of a component of the resist material. A mixing ratio may be provided in various forms (other than a strict ratio of two materials, such as A to B), such as by mass fraction (wt %), by weight %, etc. The material composition of the resist is not limited to the above-described items.

Next, a unit lattice cell of the resist is modeled by using a molecular scale simulation in operation S112. The molecular scale simulation may include atomistic models of the different molecular components (e.g., different molecules) of the photoresist, each atomistic model including the locations of atoms of the various molecules being modeled. The molecular scale model may be dynamic such that it may simulate the movement of molecules (including movement and relative locations of the atoms of each of the molecules, such as the diffusion of acid of PAG molecules in the unit lattice cell). The molecular scale model may model the change of molecular structure (e.g., due to a chemical reaction) of the molecules modeled therein (e.g., model the deprotection of a polymer, the release of acid by a PAG molecule, etc.). Here, the molecular scale simulation may be, for example, a molecular dynamics (MD) simulation. The unit lattice cell may be modeled by modeling the polymer chain and the PAG and the mixing of the same, which may include modeling the diffusion of acid released by the PAG and the mixing of the acid with the polymer chain and a resulting deprotection of the polymer chain. The unit lattice cell may further include atomistic models other components of the resist, such as quencher and surfactant. The unit lattice cell may have dimensions of a magnitude similar to an estimated critical dimension CD of a PR pattern being modeled, such as within an order of magnitude (e.g., between 0.1 times to 10 times) of a line width of a PR pattern being modeled. For example, when modeling a PR pattern having a 10 nm critical dimension line width, the unit lattice cell may have sides having dimensions of about 1 nm to 10 nm.

A unit lattice cell being modeled molecular scale simulation may model the movement and chemical change of the molecules it models over time. A unit lattice cell may be stabilized by applying a conjugate gradient method and then, may reach an equilibrium state under a corresponding process condition.

In operation S113, a PAG dissociation energy curve and the reaction speed constant of deprotection are calculated by using a quantum scale simulation in operation S113. The quantum scale simulation may be, for example, a density function theory (DFT) simulation. The PAG dissociation energy curve in accordance with secondary electron absorption that occurs in exposure may be calculated by stabilizing a molecular structure.

The PAG dissociation energy curve obtained by quantum scale simulation may be used in the molecular scale simulation to reproduce the cleavage of the ion bond of PAG molecules modeled therein (e.g., in operation S112). In the molecular scale simulation, the PAG dissociation energy curve is applied to a force field between PAG cations and anions in the exposed domain (e.g., exposed to EUV) of the unit lattice cell being modeled through the molecular scale simulation. The PAG dissociation energy curve may reproduce a dissociation reaction of the PAG in the exposed domain of the unit lattice cell of the molecular scale simulation (e.g., in a dynamic NPT ensemble of the atomistic models having model inputs of pressure and temperature). Therefore, the PAG dissociation energy curve may be used for simulating the dissociation reaction of the PAG and obtaining acid concentration profile information in the modeling of the unit lattice cell of the resist in operation S112. It will be apparent that operation S113 may occur before operation S112.

On the other hand, the reaction speed constant of deprotection of polymers of the photoresist may be calculated, for example, by applying energy and a vibrational frequency of main molecules (for example, the protection group of the polymer of the photoresist and an acid molecule) to a transition state theory (Kim et al., Macromolecules 51, 6922-6935 (2018)). The reaction speed constant of deprotection may be used for simulating deprotection in the continuum scale simulation.

In operation S114, acid diffusion and deprotection are simulated by using the continuum scale simulation. The continuum scale simulation may be, for example, an FDM (finite difference method) simulation.

In the modeling of the unit lattice cell of the resist S112, through the MD simulation, the acid concentration profile activated from the PAG anions is quantified and a position of the protection group in the unit lattice cell may be calculated. By performing the continuum scale simulation, a lattice cell of a continuum may be modeled by mapping the position of the protection group and the acid concentration profile from the unit lattice cell of the molecular scale.

Diffusion of acid concentration is quantified through the following EQUATION 1 that is the Fick's second law and the deprotection reaction between the protection group and acid may be quantified through the following EQUATION 2 that is the Arrhenius equation. That is, acid concentration is diffused in the lattice cell that is the continuum by the EQUATION 1 and a protection ratio of the protection group may be changed by the EQUATION 2. At this time, time iteration is performed by applying an explicit method and a boundary condition under which inflow and outflow of acid do not occur on the outermost surface of a cell may be applied.

$$\frac{\partial f_{acid}}{\partial t} = \nabla \cdot (D_{acid} \nabla f_{acid}) \quad \text{EQUATION (1)}$$

$$\frac{dR_{pro}}{dt} = -k f_{acid} R_{pro} \quad \text{EQUATION (2)}$$

wherein, $f_{acid}$ represents the acid concentration, $D_{acid}$ represents an acid diffusion coefficient, and $R_{pro}$ and k respectively represent the protection ratio value of an individual protection group (contributing to the overall protection ratio of the polymer chain) and the reaction speed constant of deprotection. The protection ratio of an individual protection group is reduced from 1 to 0 during the deprotection reaction. For example, the above equations may configure a model of the continuum so that the protection group positioned in a region with high concentration may rapidly perform the deprotection reaction (that is, a reduction width of $R_{pro}$ increases) by using the acid concentration $f_{acid}$ as a medium. It should be appreciated that $R_{pro}$ provides a protection ratio within a range of 0~1, corresponding to a protected pendant group site on the polymer chain, and thus reference to the protection value of an individual protection group should be understood to include the representation of the removal (or likelihood of removal) of an individual protection group. In addition, a polymer chain of a photoresist may include protected pendant groups prior to the lithographic exposure process, and these protected pendant groups may be initially assigned a protection ratio value of 1 (e.g. at time instant 1 prior to photoresist lithographic modeling as described herein).

Then, solubility of the polymer chain in the unit lattice cell in accordance with deprotection is calculated in operation S115. The solubility of the polymer chain may be calculated by obtaining an arithmetic mean value for the protection ratio values of the protection groups in the polymer chain (e.g., protection ratio values of all pendant groups of the polymer chain). In addition, it may be determined that the polymer chain is soluble in a development solvent when the protection ratio of the polymer chain is no more than a particular reference value.

Next, after removing the soluble polymer chain from the unit lattice cell in accordance with a solubility determination, the virtual resist pattern is formed in operation S116. The virtual resist pattern may be finally formed upon stabilizing of the unit lattice cell left and after removing from the unit lattice cell any polymer chain in the unit lattice cell determined to be soluble.

Then, estimation of the shape of the virtual resist pattern and various numerics of the virtual pattern are calculated in operation S117. The estimation may also include estimation of the various sizes of the virtual resist pattern (i.e., extending lengths and widths of the virtual resist pattern). In addition, the numerics of the shape of the virtual resist pattern may include the CD, the LER, the LWR, and the LCDU. However, the numerics of the shape of the virtual resist pattern are not limited to the above-described numeric. Ability of patterning the resist material selected by calculating the estimation and numerics of the shape of the virtual resist pattern may be quantified. It should be noted that the estimations performed in operation S117 may be performed by analyzing a single lattice unit cell or a group of several lattice unit cells (e.g., that are cells of a larger portion of the virtual resist pattern).

Next, in operation S118, it is determined whether the shape of the virtual resist pattern is the same as the shape of the target resist pattern or otherwise sufficiently similar by being in the allowable range. When it is determined that the shape of the virtual resist pattern is the same or sufficiently similar as the shape of the required target resist pattern (YES), the process proceeds to the forming of the resist pattern on an object to be patterned S140 in FIG. 1 (e.g., a device resist pattern as part of manufacturing a semiconductor device). When it is determined that the shape of the virtual resist pattern is different from the shape of the target resist pattern in the allowable range (NO), the process returns to the selecting of the material composition of the resist S111, the material composition of the resist is newly selected, and subsequent operations are repeated.

Figure 3B:
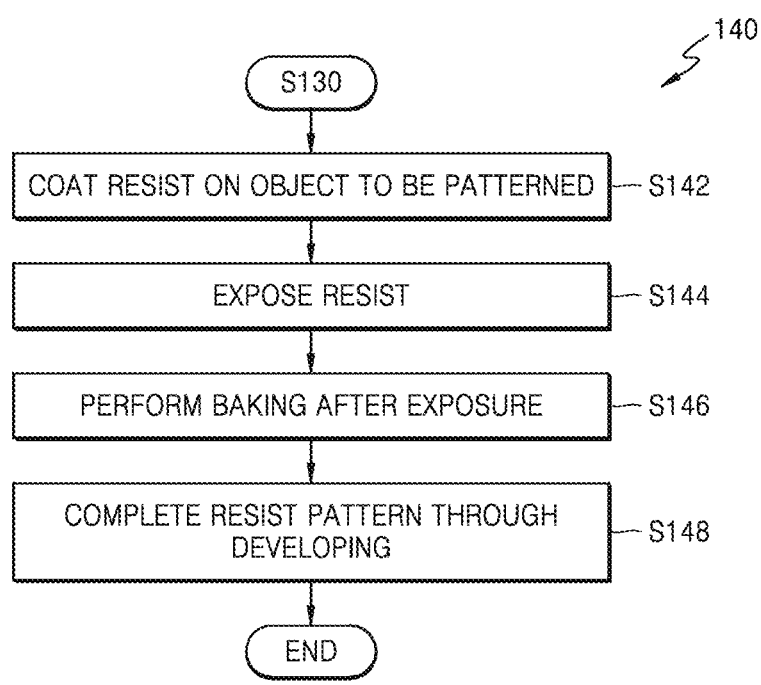
FIG. 3B illustrates a flowchart providing an example of forming the resist pattern, which may be used for operations of FIGS. 1 and 2.

Referring to FIG. 3B, in the forming of the resist pattern on the object to be patterned S140 (which may be referred to herein as a device resist pattern), first, the selected resist is coated on the object (refer to W of FIG. 12B) to be patterned in operation S142. The resist may be, for example, the EUV resist. In addition, for example, the resist may be coated on the object W to be patterned through spin coating to form a resist layer on the object W to be patterned.

After coating the resist on the object W to be patterned, the resist is exposed through an exposure device (refer to 200 of FIG. 12B) in operation S144. The exposure device 200 may be, for example, an EUV exposure device. A chemical characteristic of the resist changes through a series of reactions such as PAG dissociation, acid activation and diffusion, and deprotection through the exposure. Such a process may correspond to the multi-scale simulation of exposure of the selected resist.

After exposing the resist, the exposed resist is baked (the PEB) in operation S146. After performing the PEB, the resist is developed by the development solvent and the device resist pattern is completed in operation S148. The device resist pattern may be substantially identical to the previously formed test resist pattern in S120. In the development process, the polymer chain soluble in the development solvent is removed and accordingly, the device resist pattern may be finally formed. Here, the development solvent may be a polar or nonpolar solvent. On the other hand, the solubility of the polymer chain and the solubility of the polymer chain in the development solvent according thereto may correspond to the protection ratio of the protection group. The protection ratio and the solubility of the polymer chain according thereto will be described in more detail with reference to FIG. 8.

Figure 4A:
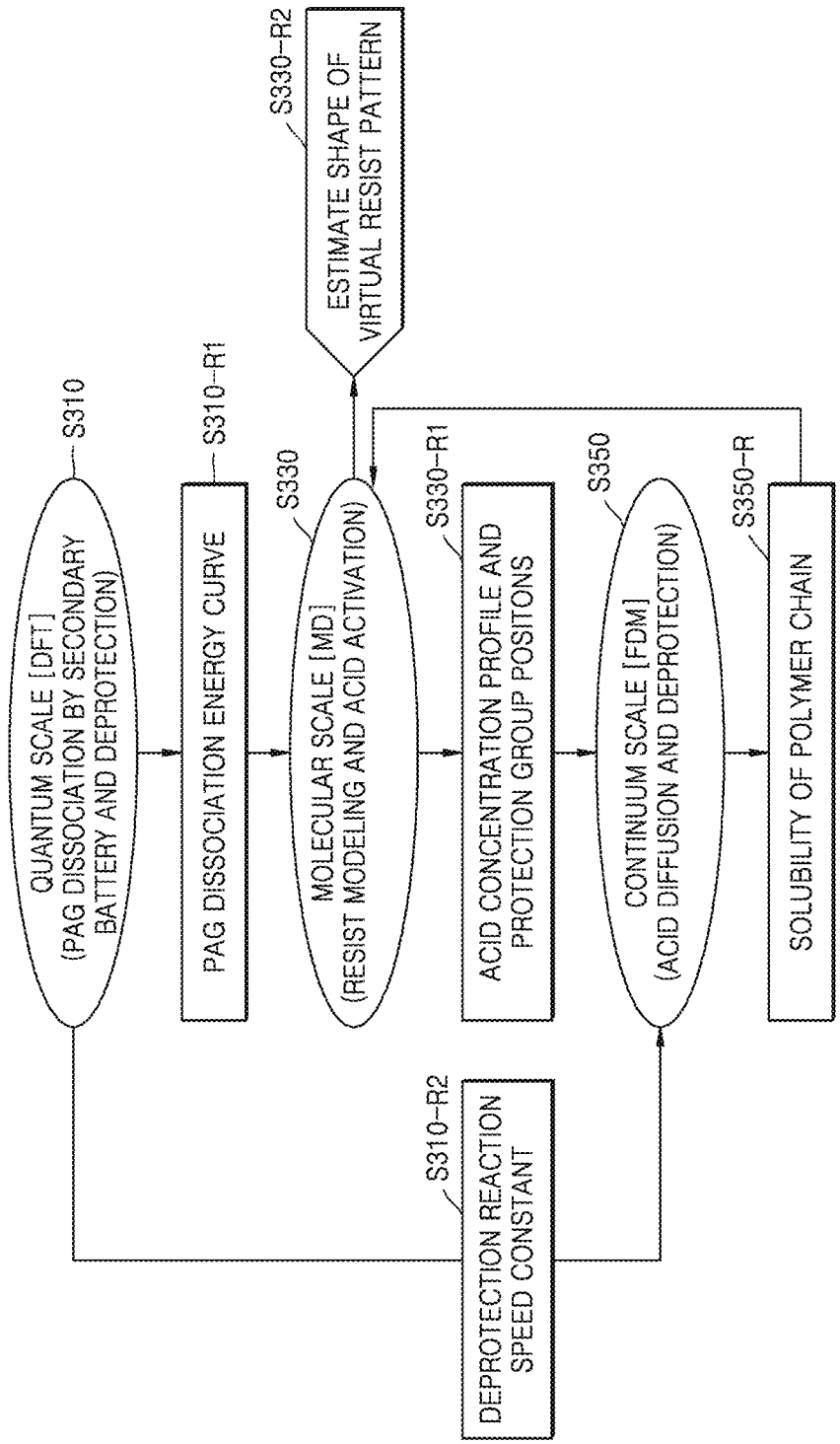
FIGS. 4A and 4B are flowcharts illustrating a correlation between simulations used for the estimating of the shape of the virtual resist pattern of FIG. 3 and a graph illustrating a result of comparing scales treated in the respective simulations.
Figure 4B:
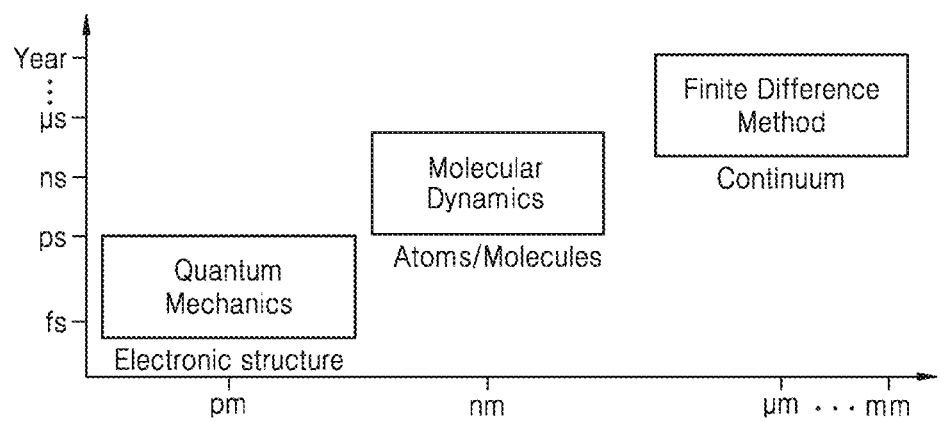

FIGS. 4A and 4B are a flowchart illustrating a correlation between simulations used for the estimating of the shape of the virtual resist pattern of FIG. 3 and a graph illustrating a result of comparing scales treated in the respective simulations. Description previously given with reference to FIGS. 1 to 3B may be omitted.

Referring to FIGS. 4A and 4B, the lithography method according to embodiments will be described as follows through the respective scale simulation processes. The respective scale simulation processes may model a photoresist (e.g., selected photoresist of operation S111) including a polymer (or polymer chain) and PAG of the photoresist.

First, in a quantum scale simulation process S310, by simulating the PAG dissociation caused by the generation of secondary electrons after the exposure of the photoresist, and the deprotection reaction between activated acid and the protection group in the polymer chain, material properties are calculated, such as determining a PAG dissociation energy curve S310-R1 and a deprotection reaction speed constant S310-R2 that are used by the molecular scale simulation and the continuum scale simulation respectively. For example, the material properties may be calculated by estimating a reactant, a product, and a molecular structure in a transition state by using the DFT simulation. In addition, the PAG dissociation energy curve is calculated by stabilizing the respective molecular structures and the deprotection reaction speed constant may be calculated by applying energy and a vibration frequency in structures of main molecules to a transition state theory.

Next, in a molecular scale simulation process S330, a unit lattice cell of the resist is modeled at a molecular level in accordance with the material composition (for example, kinds, amounts, and mixing ratios of the polymer chain and the PAG) of the selected resist and an acid concentration profile and protection group positions S330-R1 that are used by the continuum scale simulation are determined. In addition, as the multi-scale modeling progresses, the continuum scale simulation (S350) may identify e soluble polymer chains which are modeled in the molecular scale simulation in S330. The soluble polymer chains identified by the continuum scale simulation may be removed from the unit lattice cell being modeled by the molecular scale simulation in S330 (as corresponding to polymer chains removed via a developer during a photoresist development). As such, the shape of the final virtual resist pattern may be determined in S330, corresponding to the shape provided by the remaining (not removed) polymer chains in the unit lattice cell modeled by the molecular scale simulation. For example, by performing the MD simulation, the unit lattice cell is configured as a mix of amorphous polymer chains (each having a particular protection ratio) with the PAG molecules. Then, via continuum scale simulation (S30), a PAG dissociation reaction is simulated by applying the PAG dissociation energy curve (calculated by the quantum scale simulation) and position information of observed main molecules (for example, the protection group and acid) (determined by molecular scale simulation). For example, the location of certain atoms of observed main molecules (e.g., for a unit lattice cell of a molecular scale simulation, the locations of a particular atom of each PAG, a particular atom of each acid resulting from PAG dissociation and/or a particular atom of each protecting group of each polymer chain may be identified and provided as inputs to the continuum scale simulation).

Then, in the continuum scale simulation process S350, a continuum cell is modeled using a continuum scale simulation. The continuum cell may be the same portion of the resist as the unit lattice cell modeled at the molecular scale modeling and/or may encompass all or part of the unit lattice cell portion of the resist. For purposes of ease of discussion, the continuum cell may be considered to be the same portion of the resist as the unit lattice cell and further reference herein may refer to the continuum cell as the unit lattice cell.

Although the continuum cell used in the continuum scale simulation may include information that is the same as and provided by the molecular scale modeling, continuum scale modeling may perform different modeling and not use all information of the molecular scale modeling. For example, a photoresist pattern to be modeled may have a portion identified as a unit lattice cell and modeled/simulated as described herein (e.g., by the molecular scale modeling of S330). The unit lattice cell, having its atom locations identified by such molecular scale modeling, may be divided into sub-unit cells (e.g., FDM sub-unit cells) (e.g., having cell dimensions of 0.2 nm or less). Each sub-unit cell may be a cuboid and each vertex of the cuboid may be assigned certain properties (e.g., acid concentration). Properties of a location within the sub-unit cell may be determined from the properties assigned to the vertices of the cuboid, such as through interpolation, which may be linear interpolation, such as trilinear interpolation. The unit lattice cell in the continuum scale model also maps the positions protection group (which may be identified as the position of a particular atom of the protection group corresponding to an atom of the protection group prone to react with the activated acid dissociated from the PAG (e.g., an oxygen atom of the protection group)). For each protection group position, an acid concentration is determined from the continuum scale model and it is determined if the corresponding protection group is removed from the polymer (e.g., the polymer is deprotected by the removal of the corresponding protection group) or the likelihood thereof. The protection ratio of a polymer (corresponding to the number of protection groups of the polymer) is analyzed to determine if the polymer is soluble (and may be removed from the unit lattice cell model, as modeled by both the molecular scale model and the continuum scale model). The protection group positions and a concentration profile of activated acid from the unit lattice cell of the resist may be obtained from the molecular scale model. For example, the distances between activated acids (from corresponding PAG molecules) and nodes (e.g., vertices) of the continuum scale model may be determined by the molecular scale model and provide an acid concentration value for each node (e.g., each vertex) of the continuum scale model. For example, by using the FDM simulation, the diffusion of the acid concentration is quantified by the EQUATION 1 that is the Fick's second law and the deprotection reaction is quantified by the EQUATION 2 that is the Arrhenius equation. Solubility S350-R of the polymer chain in the unit lattice cell in accordance with the deprotection reaction may be calculated through the EQUATION 2. As described above, the above equations may configure the continuum scale model and may model rapid chemical reactions with the protection groups that are positioned in regions having high acid concentration.

As noted from FIG. 4A, calculation results may be used among the respective scale simulations. For example, the identity of any polymer chain determined to be soluble S350-R (identified in the continuum scale simulation process S350), is transmitted to the molecular scale simulation process S330 and the soluble polymer chain is removed from the unit lattice cell and accordingly, the shape S330-R2 of the final virtual resist pattern may be estimated.

On the other hand, as noted from FIG. 4B, in the quantum scale simulation, a scale is at a pm level of quantum mechanics that treat electrons, in the molecular scale simulation, a scale is at an nm level of molecular dynamics that identifies individual atoms or molecules. The continuum scale simulation may simulate a photoresist process larger than nm level, such as at a scale of $\mu m$ level (although its sub-units may be smaller than the unit lattice cell as discussed herein). On the other hand, in terms of the reaction speed, in the quantum scale simulation, a time-step scale may range between fs and ps, in the molecular scale simulation, a time-step scale may range between ps to $\mu s$, and in the continuum scale simulation, a time-step scale may range from ns or higher. Such time-step scales may represent the increments of time-steps in the modeling of the photoresist or its elements as it/they change position and/or structure with time.

Figure 5A:
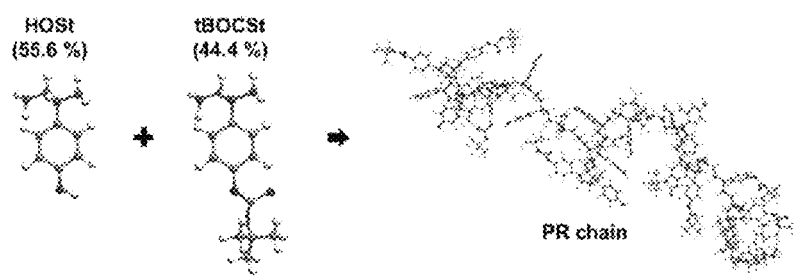
FIGS. 5A and 5B are conceptual diagrams illustrating a molecular structure of a polymer chain (FIG. 5A) and a molecular structure of a PAG (FIG. 5B) that configure a resist and FIG. 5C is a conceptual diagram illustrating a unit lattice cell of a resist.
Figure 5B:
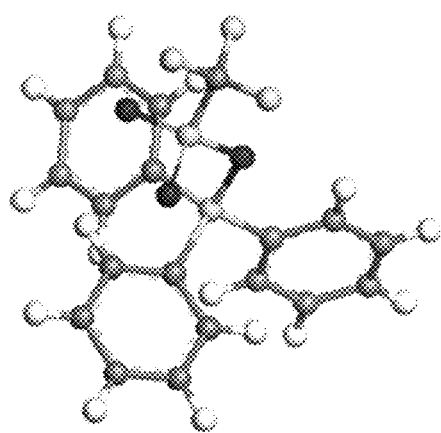
Figure 5C:
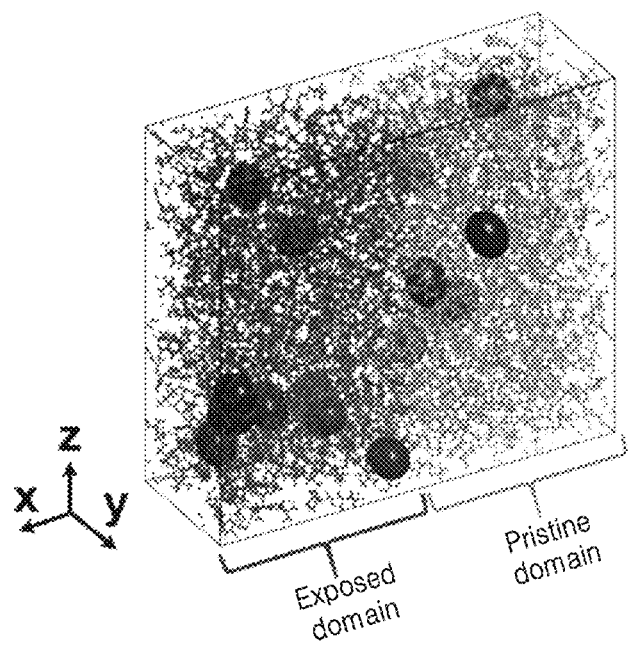

FIGS. 5A and 5B are conceptual diagrams illustrating a molecular structure of a polymer chain (FIG. 5A) and a molecular structure of a PAG (FIG. 5B) that configure a resist and FIG. 5C is a conceptual diagram illustrating a unit lattice cell of a resist.

Referring to FIGS. 5A to 5C, in the lithography method according to the current embodiment, the resist may be modeled to only include a mixture of polymer chains and PAGs, however other substances of a photoresist may also be included as part of the model (as described elsewhere herein). FIG. 5A represents that each polymer chain may comprise a plurality of pendant groups which may be a combination of protection groups (e.g., tBOCSt in this specific example) and non-protection groups (HOSt in this specific example). For a particular polymer chain, the ratio of the number of protection groups to total pendant groups (e.g., a ratio of #tBOCSt/(#HOSt+#tBOCSt)) may correspond to a protection ratio of that polymer chain. In the multi-scale simulation, the protection ratio of a polymer chain may be estimated by calculating or assigning a protection ratio value $R_{pro}$ for each pendant group of the polymer chain and obtaining an average of all of these protection ratio values. For example, for each HOSt, a protection ratio value $R_{pro}$ of 0 may be assigned and for each tBOCSt, a protection ratio value Rpm may be assigned an initial value of 1 and reduced over time as calculated per EQUATION 1. The multi-scale simulation described herein may:
(i) determine a protection ratio value $R_{pro}$ for each pendant group of the polymer chain (representing a likelihood of whether such protection group should be considered removed from the corresponding polymer or remain attached to the polymer) (the protection ratio value $R_{pro}$ may be responsive to a determined acid concentration at the location of each protection group),
(ii) determine a corresponding protection ratio for each polymer chain, and
(iii) determine if each polymer chain should be considered soluble based on its corresponding determined protection ratio (and thus removed from the model as corresponding to having been removed by developer) (such as when the protection ratio falls below a predetermined value, such as below 20%).

FIG. 5C illustrates an exemplary unit lattice cell of the resist in which polymer chains and the PAGs are mixed together. In FIG. 5C, black ovals represent the PAGs. The darker portion of the unit lattice cell (left side) represents an exposed domain (the region of the lattice cell that was exposed to light in the lithographic exposure process) and the lighter gray portion (right side) represents a pristine domain that (not exposed to light during the lithographic exposure process). As described above, secondary electrons are generated in the exposed domain and combine with the PAG and accordingly, the PAG dissociation reaction occurs to release the acid of the PAG, which then diffuses through the photoresist and deprotects certain protection groups of the polymer chains (as described herein).

FIGS. 6A to 6D are conceptual diagrams illustrating acid activation in an exposed domain and an acid concentration profile according thereto.

Referring to FIGS. 6A to 6D, in the lithography method according to embodiments, for example, by applying the multi-scale simulation to material compositions of a carbonate based polymer chain and a sulfonic acid generator based PAG, the photochemical reaction of exposure->PAG dissociation->acid activation is illustrated. The material composition of the resist to which the multi-scale simulation and corresponding lithography method is applied of is not limited to the above-described material composition. The quantum scale DFT simulation and the molecular scale MD simulation may be used for modeling this photochemical reaction.

In detail, using the MD simulation, the unit lattice cell of the resist is modeled by applying the PAG dissociation energy curve (calculated through the DFT simulation) to the force field of each PAG that is positioned in the exposed domain of the unit lattice cell. Within nano-seconds, the PAG may be dissociated and thus divided into the PAG cations and PAG anions (acid from the PAG). The acid concentration profile of the unit lattice cell may be determined from the dissociated anions and may be quantified through the MD simulation. As a result, the acid concentration profile (initially concentrated in the exposed domain of the unit lattice cell) may be determined and may be used for the continuum scale simulation.

Figure 6A:
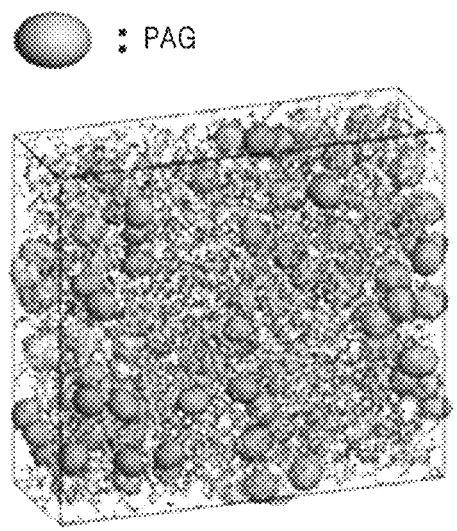
FIGS. 6A to 6D are conceptual diagrams illustrating acid activation in an exposed domain and an acid concentration profile according thereto.
Figure 6B:
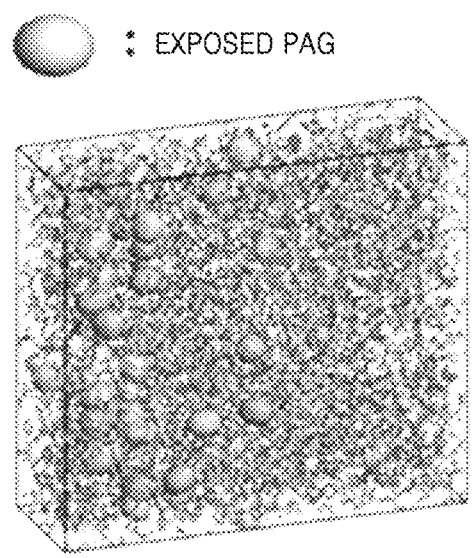
Figure 6C:
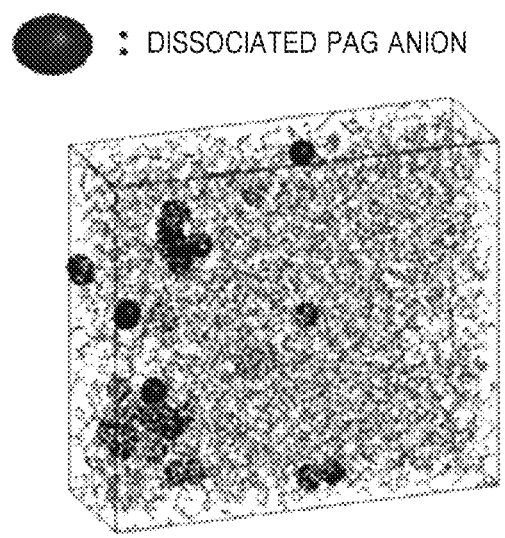
Figure 6D:
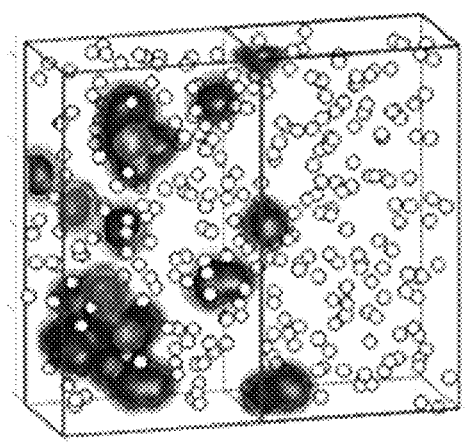

FIG. 6A illustrates the unit lattice cell of the resist before lithographic exposure where the elliptical spheres in the unit lattice cell represent the PAGs. Remaining portions within the unit lattice cell shown in FIG. 6A include atomistic models (as modeled by MD simulation) of the materials of the photoresist (e.g., atomistic models of the polymer chains, representing the location of the constituent atoms and bonds for each polymer chain). FIG. 6B illustrates the unit lattice cell immediately after the exposure where the exposed PAGs are marked with the elliptical spheres in the exposed domain. The PAG in the non-exposed domain is not shown (and may be removed from the modeling at this point if appropriate). FIG. 6C illustrates a process in which the exposed PAG is dissociated and divided into the PAG cations and anions, corresponding to an acid activation process of each PAG molecule. Black elliptical spheres represent the dissociated PAG anions. FIG. 6D illustrates an activated acid concentration profile of the unit lattice cell obtained through the MD simulation. In FIG. 6D, the acid concentration varies as represented by a dark color and a light color for each acid concentration cluster (corresponding in position to the dissociated PAG anions of FIG. 6C). Further, the acid concentration within the unit lattice cell may continue to change with time as represented through the multi-scale simulation.

FIGS. 7A to 7D are conceptual diagrams illustrating details of the acid diffusion and deprotection that may be modeled according to embodiments.

Referring to FIGS. 7A to 7D, in the lithography method according to embodiments, by applying the multi-scale simulation to the material compositions of the photoresist (e.g., carbonate based polymer chains and sulfonic acid generator based PAGs), activated acid diffusion and the deprotection reaction may be modeled. The molecular scale MD simulation may model the locations of the materials of the photoresist, such as locations of PAGs and polymer chains which may include modeling the location of the atoms forming such materials. In addition, the molecular scale MD simulation may provide the location of the initial acid concentration resulting from a PAG disassociation. The continuum scale FDM simulation may be used to model the acid diffusion within the unit lattice cell and the deprotection reaction of the polymer chains and the acid.

In detail, the local acid concentration $f_{acid}$ in the unit lattice cell and a change in the protection ratio value $R_{pro}$ of the protection group may be calculated by using the FDM simulation. For example, the diffusion of the acid concentration $f_{acid}$ and the change in the protection ratio value $R_{pro}$ may be calculated through the EQUATIONS 1 and 2. As a result, it may be noted that, due to acid concentrated in the exposed domain, the deprotection reaction (chemical reaction) of polymer chains occurs (resulting in the removal of protection groups of the polymer chains) in the exposed domain. The protection ratio of each polymer chain may thus be altered (lowered) by the removal of one or more of its protection groups as the acid diffuses through the unit lattice cell and interacts and removes such protection groups. The protection ratio of each polymer chain may be modeled by averaging the protection ratio value $R_{pro}$ calculated for each pendant group of the polymer chain. The protection ratio of each polymer chain may determine if the polymer chain is considered a soluble polymer chain (and thus subject to removal from the model).

Figure 7A:
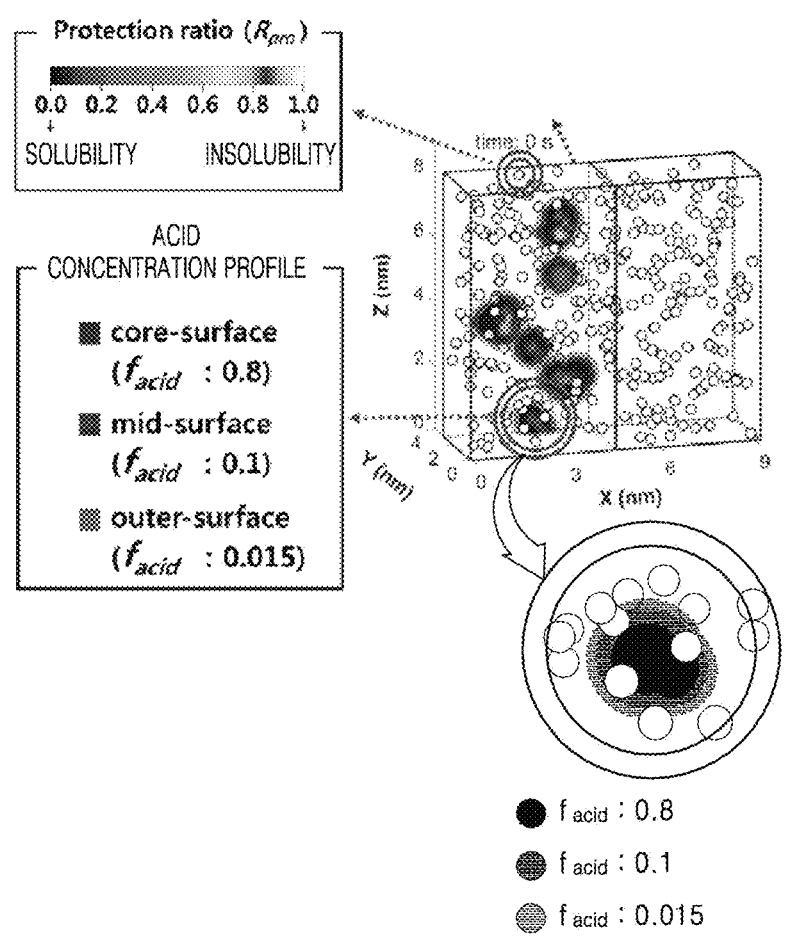
FIGS. 7A to 7D are conceptual diagrams illustrating acid diffusion and deprotection.

FIG. 7A illustrates the initial (time instant of 0 s of the model) acid concentration profile like in FIG. 6D. The upper left box is a key showing grey shades corresponding to a protection ratio value $R_{pro}$ of each protection group of each polymer chain (as represented by the corresponding shading of the circles in the unit lattice cell). When the protection ratio is 1, the protection group is insoluble in a polar solvent. As the protection ratio is reduced to 0, solubility in the polar solvent may increase.

In the lower left square box, the acid concentration profile is denoted with three shades of grey. For example, as noted from the lower enlarged view of FIG. 7A, for each location corresponding to a dissociated PAG, an acid concentration profile may be gradually reduced with distance from a central position.

Figure 7B:
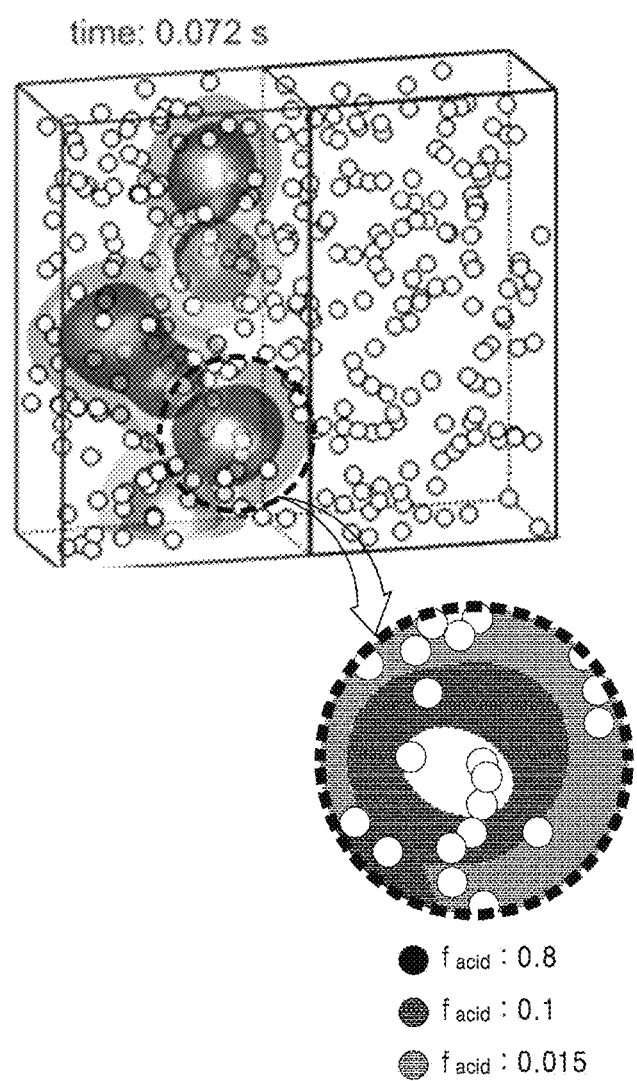
Figure 7C:
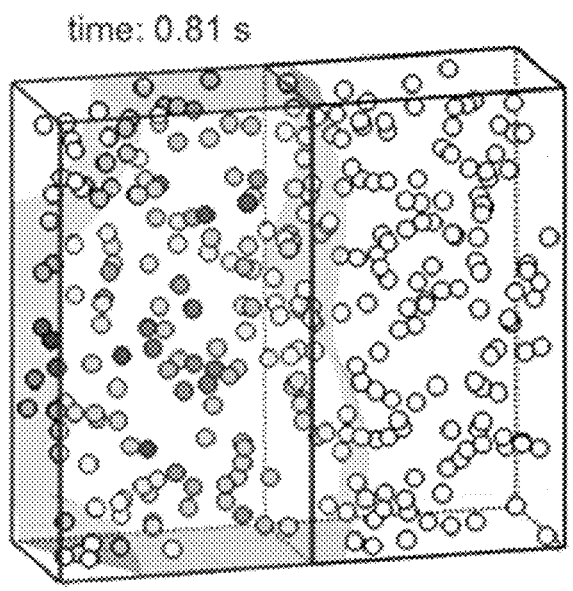
Figure 7D:
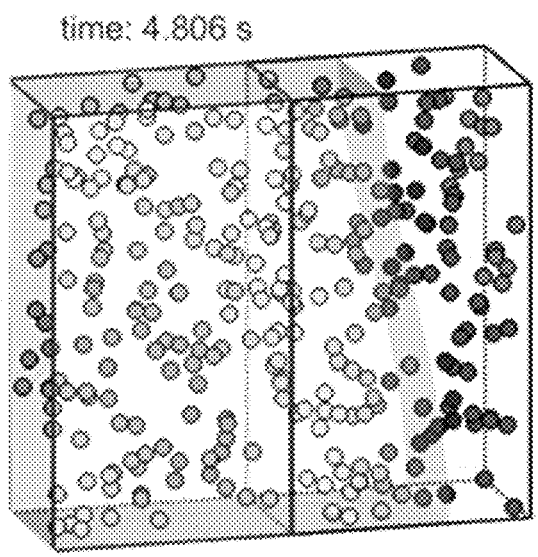

FIGS. 7B to 7D show the subsequent diffusion of the acid with time at time instants of 0.072 s, 0.81 s and 4.806 s, respectively (as described herein, as modeled by FDM or other continuum scale modeling based on an acid diffusion constant and acid concentrations of a previous time instant of the FDM model). In FIG. 7B, the acid is gradually diffused in the unit lattice cell and the acid concentration is reduced . It is noted from FIG. 7C that the acid concentration is diffused over most of the exposed domain as denoted by grey sheet-like boundary. In addition, FIGS. 7B to 7D represent the deprotection reaction occurring (with respect to the protection groups) and accordingly, the protection ratio of polymer chains may be reduced in the exposed domain. The acid diffusion and deprotection reaction process is not limited to the example illustrated in FIGS. 7A to 7D.

With the lapse of time, the acid concentration may be diffused to the non-exposed domain (right hand side of unit lattice cell). FIG. 7D illustrates the acid diffusion into the non-exposed domain (grey sheet like boundary extended into non-exposed domain) and a corresponding change in the protection ratio value $R_{pro}$. It is noted from FIG. 7D that because acid concentration is diffused to a portion of the non-exposed domain, the protection ratio value $R_{pro}$ of the protection groups in the non-exposed domain and the protection ratio of corresponding polymer chains may be reduced by the deprotection reaction. On the other hand, at this time, in the protection groups of the exposed domain, the deprotection reaction occurs more than in the non-exposed domain and accordingly, the protection ratio value $R_{pro}$ in the exposed domain may be significantly reduced.

Figure 8:
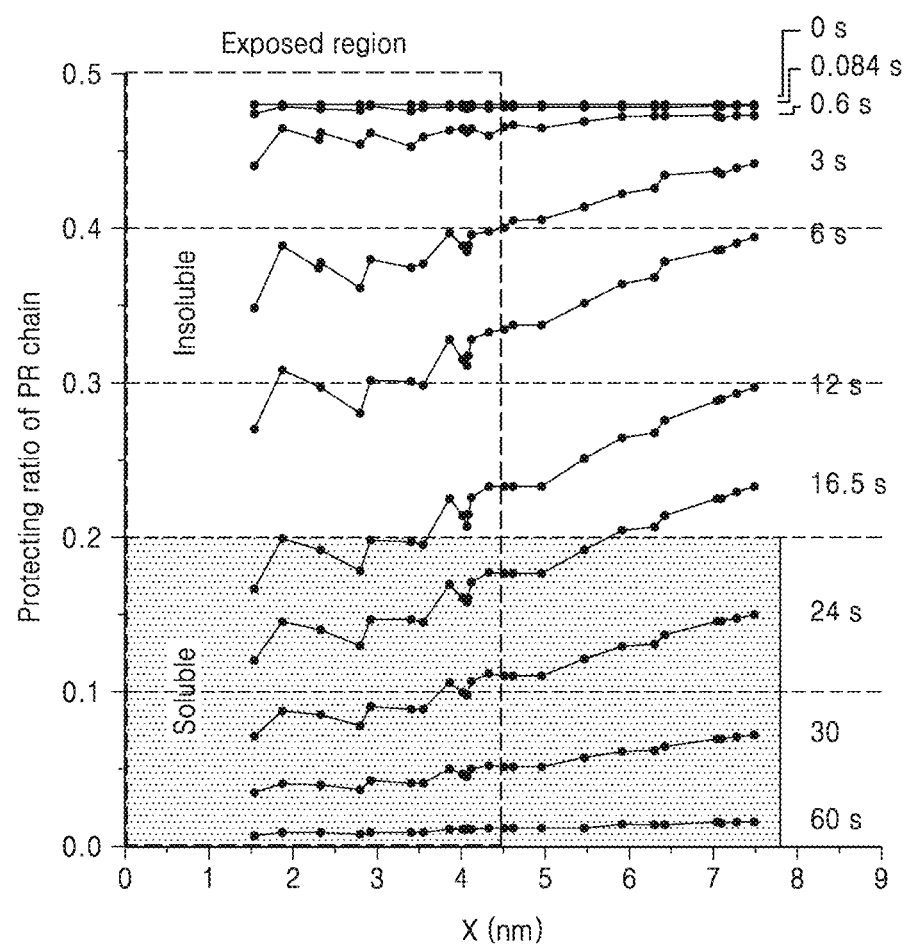
FIG. 8 is a graph illustrating solubility of a polymer chain after deprotection in accordance with acid diffusion.

FIG. 8 is a graph illustrating solubility of a polymer chain after deprotection in accordance with acid diffusion. The x axis represents a position along the unit lattice cell, the y axis represents the protection ratio, and a dotted line that perpendicularly extends from the x axis (just left of 4.5 nm) distinguishes the exposed domain from the non-exposed domain.

Referring to FIG. 8, it may be noted that, with the lapse of time, the protection ratio of a polymer chain is gradually reduced from its initial value (about 0.48 in this example) to 0. When the protection ratio is almost 0.2, the corresponding polymer chain may be determined to have solubility. Therefore, in FIG. 8, based on the protection ratio of 0.2, an upper side is distinguished from a lower side by hatching. It is noted from FIG. 8 that, when the solubility is determined based on the protection ratio of 0.2, at about 12 seconds of reaction time, most of the protection groups in the exposed domain have solubility and the protection groups in the non-exposed domain have little solubility. Here, the solubility may mean solubility in the development solvent applied to the photoresist in the development step after exposure and PEB.

Figure 9A:
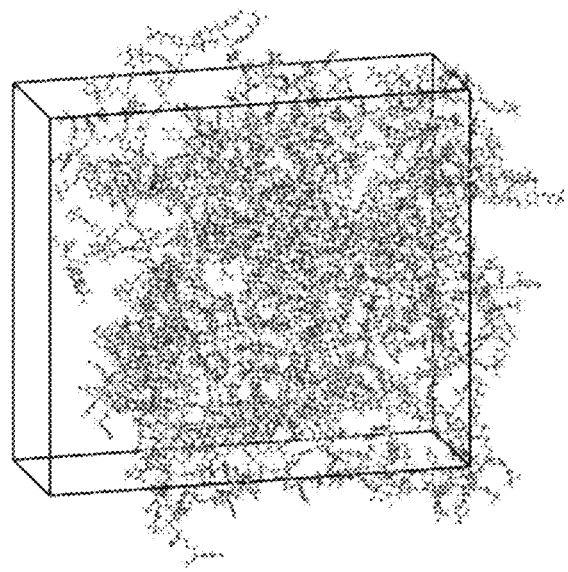
FIGS. 9A to 9C are conceptual diagrams illustrating a process of removing a soluble polymer chain and a shape of a virtual resist pattern.
Figure 9B:
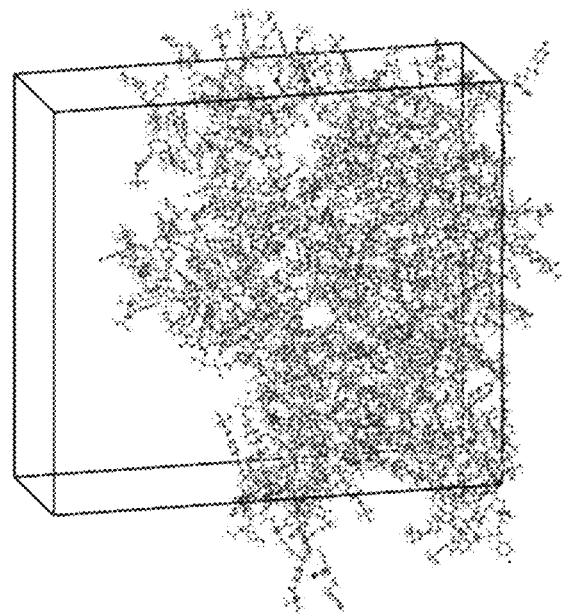
Figure 9C:
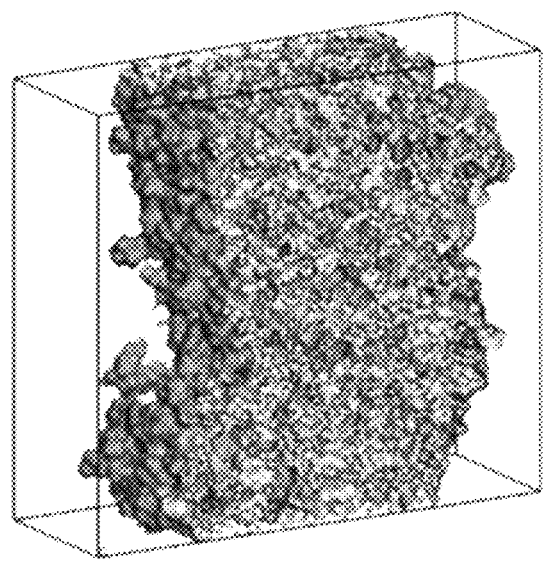

FIGS. 9A to 9C are conceptual diagrams illustrating a process of removing a soluble polymer chain and a shape of a virtual resist pattern.

Referring to FIGS. 9A to 9C, in the lithography method according to the current embodiment, as described in FIGS. 6A to 6D, the shape of the resist pattern calculated by applying the multi-scale simulation to the material compositions of the carbonate based polymer chain and the sulfonic acid generator based PAG is illustrated. The shape of the resist pattern may modeled by MD simulation by determining the solubility of polymer chains in the unit lattice cell in accordance with the determined protection ratio as described herein.

In detail, polymer chains identified as soluble may be removed from the unit lattice cell modeled by the MD simulation. After removing the selected soluble polymer chain from the unit lattice cell in accordance with the determination of solubility (such as determined with the protection ratio values calculated through the FDM simulation to the unit lattice cell modeled by the MD simulation), the resist pattern may be considered stabilized at some stage (e.g., stabilized when the PEB process is ended). Then, the MD simulation model may determine the resulting shape of the resist pattern from the remaining polymer chains (that were not removed) of the unit lattice cell. For example, a boundary between the remaining polymer chains and space where removed (soluble) polymer chains may be determined (e.g. based on the atomistic models of the remaining polymer chains in the unit lattice cell of the MD simulation model). The LER, the LWR, and the LCDU of the resist pattern may be calculated and quantified from the resulting shape of the of the resist pattern for the selected resist. Thus, patterning performance for the material composition of the selected resist may be quantified.

FIG. 9A illustrates a state in which about 14% of the polymer chains are removed from the unit lattice cell, FIG. 9B illustrates a state in which about 32% of the polymer chains are removed, and FIG. 9C illustrates the final resist pattern shape after the resist is stabilized. A protection ratio of the polymer chain, indicating the solubility of the polymer chain, is determined in accordance with the protection ratio values $R_{pro}$ (e.g., an average value of the protection ratio values $R_{pro}$ of all pendant groups of the polymer chain). When the protection ratio of the polymer chain is no more than a predetermined reference value, for example, no more than 0.2 (where such predetermined reference value may be set by a user), it is determined that the polymer chain is soluble to the development solvent and accordingly, the polymer chain may be removed from the multi-scale model (e.g., removed from the MD model at the time instant corresponding to the determination of polymer solubility, at period of stabilization of the acid diffusion within the FDM model, etc.).

In the lithography method according to the current embodiment, by using the multi-scale simulation, the physical phenomena at the multilevel such as exposure->generation of secondary electrons->PAG dissociation and acid activation->acid diffusion and deprotection of the polymer chain->change in polymer solubility->development may be simulated. Therefore, in the lithography method according embodiments, (for example, including multi-scale EUV lithography), the resist pattern shape may be correctly calculated and estimated. In addition, in the lithography method according to the current embodiment, by using the multi-scale simulation, manufacturing development cost and time of selecting and/or optimizing the lithographic process of the corresponding resist may be significantly reduced and process conditions in the lithography process may be improved.

Figure 10:
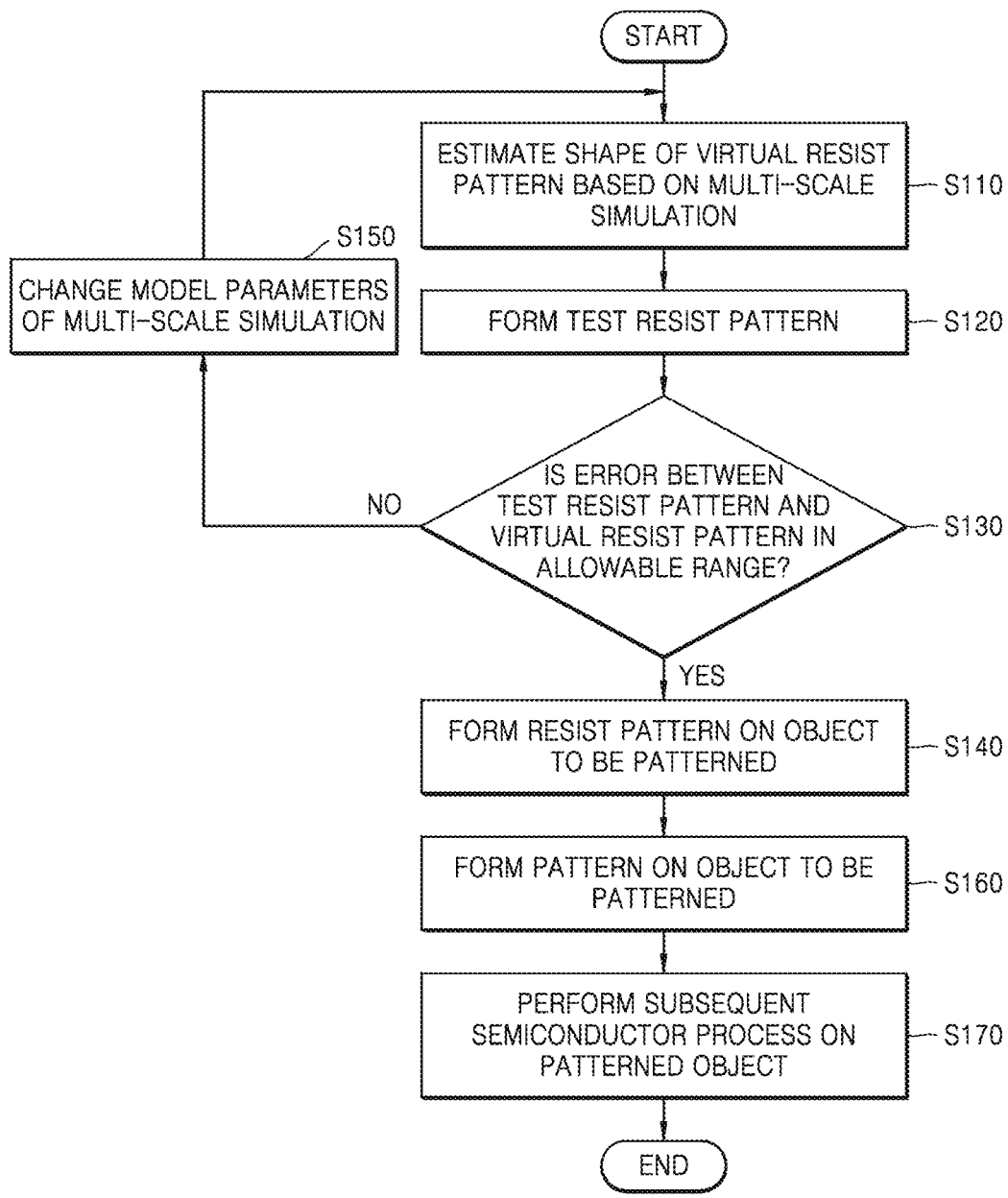
FIG. 10 is a flowchart illustrating a semiconductor manufacturing method based on the lithography method of FIG. 1 according to an embodiment of the inventive concept.

FIG. 10 is a flowchart illustrating a semiconductor manufacturing method based on the lithography method of FIG. 1 according to an embodiment of the inventive concept. Description previously given with reference to FIGS. 1 to 9C may be omitted.

Referring to FIG. 10, operations S110, S120, S130, S140 and S150 may be the same as described elsewhere herein (e.g., with respect to FIG. 1 and related detail) and estimating of the shape of the virtual resist pattern S110 and the forming of the resist pattern on the object to be patterned S140 are sequentially performed.

In operation S160, a pattern is formed on the object to be patterned (i.e., the object is patterned). For example, the object may be a layer of a semiconductor device being manufactured and/or formed during such manufacturing (such as an insulating layer, a conductive layer, a hard mask layer, etc. (refer to wafer W of FIG. 12B) and may be patterned by etching using the patterned resist as an etching mask (which may result in the transfer of the pattern of the resist pattern to the object). The etching process that patterns the object may be a dry etch process or a wet etch process. It should be appreciated that the patterned object (e.g., a patterned layer) as well as the patterned resist may be removed as part of the manufacturing process and need not be part of the final semiconductor device. For example, the resist pattern may be formed on a hard mask layer of a wafer W, the hard mask layer may be patterned using the resist pattern, the resist pattern may be removed, the hard mask layer may be used to pattern a layer below the hard mask layer, and the hard mask layer may be removed (or further patterned by another formed mask).

After forming the pattern on the object W to be patterned, subsequent semiconductor processes are performed on the object W in operation S170. A semiconductor device may be manufactured by performing the subsequent semiconductor processes on the object W. For example, when the object W is a wafer, a plurality of semiconductor devices may be manufactured from the wafer W (and singulated from the wafer W).

The subsequent semiconductor process performed on the wafer may include various processes. For example, the subsequent semiconductor processes performed on the wafer may include a deposition process, an etching process, an ion implantation process, and/or a cleaning process. In addition, the subsequent semiconductor processes performed on the wafer may include a process of testing the semiconductor device formed in the wafer W (which may be a wafer-level testing or subsequent testing after singulation from the wafer W). Furthermore, the subsequent semiconductor processes performed on the wafer may include a singulation process of dividing the wafer into individual semiconductor chips and a process of packaging the semiconductor chips. Here, in the packaging process, the semiconductor chips may be mounted on a package substrate (e.g., a printed circuit board (PCB)) and are encased by an encapsulant (a sealing material). A stack package may be formed by stacking a plurality of semiconductor devices (i.e., chips) on the PCB as multiple layers or a package on package (POP) structure may be formed by stacking a stack of packages. Through the process of packaging the semiconductor chips, a semiconductor device formed as a semiconductor package may be formed.

Figure 11:
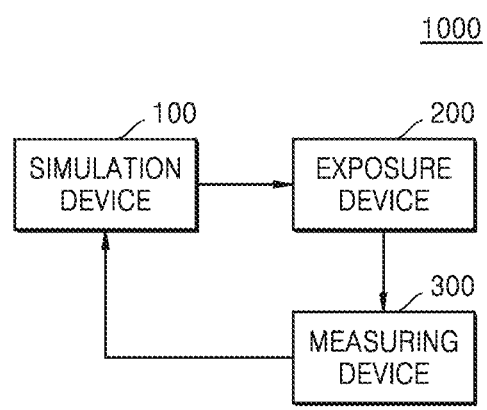
FIG. 11 is a block structural view illustrating exposure equipment based on the lithography method of FIG. 1 according to an embodiment of the inventive concept.

FIG. 11 is a block structural view illustrating exposure equipment 1000 configured to implement one or more of the lithography methods described herein (e.g., of FIG. 1) according to an embodiment of the inventive concept.

Referring to FIG. 11, the exposure equipment 1000 according to the current embodiment may include a simulation device 100, an exposure device 200, and a measuring device 300. The simulation device 100 may estimate of the shape of the virtual resist pattern according to any of the lithography methods described herein (e.g., of FIG. 1) by using multi-scale simulation. The simulation device 100 may be one or more computers configured by software. It should be appreciated that several interconnected computers to communicate with one another may be considered a single computer.

The exposure device 200 may perform the exposure process on the resist. The exposure device 200 may be a lithographic exposure device. Exposure device 200 may be supplemented with a resist deposition device, a post exposure bake chamber, a development device, etc. The resist that is exposed by the exposure device 200 may be selected based on the result of the multi-scale simulation performed by the simulation device 100. It should be appreciated that the simulation device 100 may be separate from the exposure equipment 1000 and formed as a separate device. The exposure device 200 may be, for example, the EUV exposure device. The exposure device 200 is not limited to the EUV exposure device. A structure of the exposure device 200 will be described in more detail with reference to FIG. 12B.

The measuring device 300 measures the test resist pattern formed or the resist pattern formed on the object as a result of exposure via the exposure device 200. For example, the measuring device 300 may measure the CD, the LER, the LWR, and the LCDU of the test resist pattern or the resist pattern formed on or the object. It should be appreciated that the measuring device 300 may be separate from the exposure equipment 1000 and formed as a separate device.

The exposure equipment 1000 according to the current embodiment may include the simulation device 100 for performing the multi-scale simulation. Therefore, the exposure equipment 1000 according to the current embodiment may select an optimal resist (e.g., select a predefined resist based upon its composition or select the various compositions of a resist and/or their amounts to create a resist) by estimating the shape of the virtual resist pattern by using the simulation device 100 and may form the resist pattern by using the selected resist through use of the exposure device 200. As a result, the exposure equipment 1000 according to the current embodiment may correctly form the resist pattern that coincides with the target resist pattern in the allowable range, may form a precise pattern on the object to be patterned by patterning the object using the resist pattern, and may contribute to manufacturing of a reliable semiconductor device.

Figure 12A:
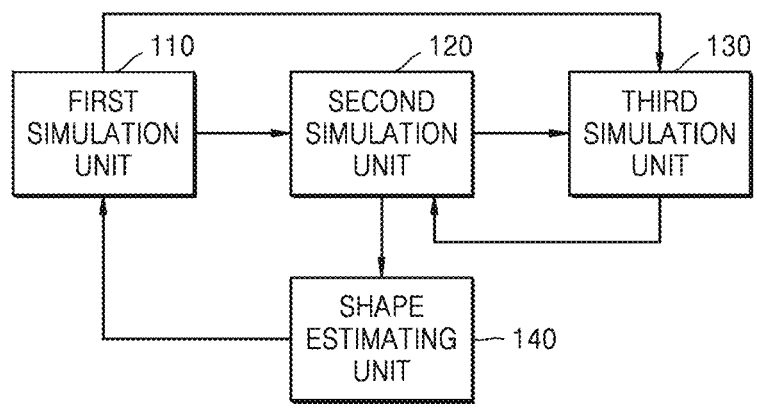
FIG. 12A is a block diagram illustrating an example simulation device and FIG. 12B illustrates exemplary features of an exposure device.
Figure 12B:
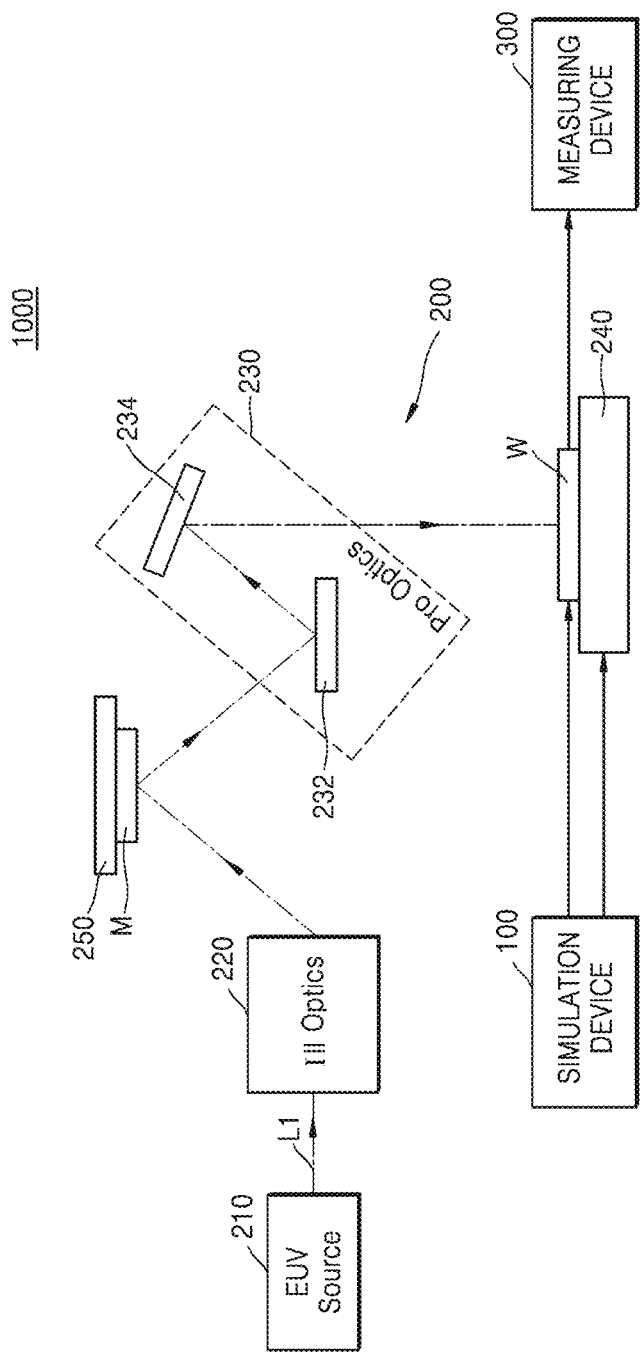

FIG. 12A is a block diagram illustrating an example simulation device 100, such as that formed as part of the exposure equipment 1000 of FIG. 11. FIG. 12B illustrates exemplary features the exposure device 200 of the exposure equipment 1000 of FIG. 11 in more detail.

Referring to FIG. 12A, the simulation device 100 may include first to third simulation units 110, 120, and 130 and a shape estimating unit 140. These units, like other units described herein, may take the form of a separately configured computer or controller, and/or may constitute software code that configures the same or different computers (and/or the same or different microprocessors of such computer(s)). Such software code of each unit may take the form of one or more software routines forming software modules which may share software and/or hardware resources with other units. The first to third simulation units 110, 120 and 130 and the shape estimate unit 140 may communicate with one another to provide information to implement the methods described herein. The first simulation unit 110 may perform the quantum scale simulation. For example, the first simulation unit 110 may perform the DFT simulation. The second simulation unit 120 may perform the molecular scale simulation. For example, the second simulation unit 120 may perform the MD simulation. The third simulation unit 130 may perform the continuum scale simulation. For example, the third simulation unit 130 may perform the FDM simulation.

The shape estimating unit 140 may estimate the shape of the virtual resist pattern formed by the first to third simulation units 110, 120, and 130. In addition, the shape estimating unit 140 may quantify patterning performance for the material composition of the selected resist by calculating the CD, the LER, the LWR, and the LCDU. According to an embodiment, a function of the shape estimating unit 140 may be performed by being integrated with the second simulation unit 120.

Referring to FIG. 12B, in the exposure equipment 1000 according to the current embodiment, the exposure device 200 may be the EUV exposure device. However, the exposure device 200 is not limited to the EUV exposure device. Hereinafter, for convenience sake, the EUV exposure device will be mainly described. The exposure device 200 may include an EUV light source 210, an illumination optics 220, a projection optics 230, a stage 240, and a mask support 250.

The EUV light source 210 may generate high energy concentration EUV L1 in a wavelength range of about 5 nm to 50 nm and may output the generated high energy concentration EUV L1. For example, the EUV light source 210 may generate high energy concentration EUV L1 of a wavelength of 13.5 nm and may output the generated high energy concentration EUV L1.

The illumination optics 220 includes a plurality of mirrors and may transmit the EUV L1 from the EUV light source 210 to an EUV mask M (e.g., a photolithographic mask) arranged on the mask support 250. For example, the EUV L1 from the EUV light source 210 may be incident on the EUV mask M arranged on the mask support 250 through reflection performed by the mirrors in the illumination optics 220.

The EUV mask M may be a reflective mask including a reflection region and a non-reflection and/or intermediate reflection region. The EUV mask M may include a pattern configured by a reflection multilayer for reflecting EUV on a substrate formed of a low thermal expansion coefficient material (LTEM) such as quartz and an absorption layer pattern formed on the reflection multilayer. The reflection multilayer may have, for example, a structure in which no less than dozens of Mo layers and Si layers are alternately stacked. The absorption layer may be formed of, for example, TaN, TaNO, TaBO, Ni, Au, Ag, C, Te, Pt, Pd, or Cr. However, a material of the reflection multilayer and a material of the absorption layer are not limited to the above-described materials. Here, the absorption layer may correspond to the non-reflection and/or intermediate reflection region.

The EUV mask M may reflect the EUV L1 incident through the illumination optics 220 and may have the reflected EUV L1 incident on the protection optics 230. In more detail, the EUV mask M may structuralize the illumination light from the illumination optics 220 to projection light based on the shape of the pattern configured by the reflection multilayer and the absorption layer on the substrate and may have the projection light incident on the projection optics 230. The projection light may be structuralized through at least secondary diffraction order due to the pattern of the EUV mask M. The projection light is incident on the projection optics 230 with shape information of the pattern on the EUV mask M, passes through the projection optics 230, and may transcribe an image corresponding to the pattern of the EUV mask M onto the object W to be patterned.

The object W to be patterned may be a substrate formed of a semiconductor material such as Si, for example, a semiconductor wafer. The object W exposed to the projection light may have the resist coated thereon and may be an EUV resist, e.g.

The object W to be patterned may be arranged on the stage 240. The stage 240 may move in x and y directions on an x-y plane and may move in a z direction perpendicular to the x-y plane. Therefore, due to the movement of the stage 240, the object W to be patterned may also move in the x, y, and z directions.

The projection optics 230 may include a plurality of mirrors. In FIG. 12B, only two mirrors, that is, a first mirror 232 and a second mirror 234 are illustrated in the projection optics 230 for convenience sake. However, the projection optics 230 may include more mirrors. For example, the projection optics 230 may commonly include four to eight mirrors. The number of mirrors included in the projection optics 230 is not limited to the above numeric.

While the inventive concept has been particularly shown and described with reference to embodiments thereof, it will be understood that various changes in form and details may be made therein without departing from the spirit and scope of the following claims.

What is claimed is:

1. A lithography method using a multi-scale simulation, the lithography method comprising:
    estimating a shape of a virtual resist pattern based on a multi-scale simulation for a selected resist, wherein the selected resist models a resist using one of resist materials;
    forming a test resist pattern by performing exposure on a layer formed of the selected resist;
    comparing the test resist pattern with the virtual resist pattern; and
    forming a device resist pattern formed of the selected resist on an object to be patterned when an error between the test resist pattern and the virtual resist pattern is in an allowable range, wherein the resist is for an extreme ultra-violet (EUV), ArF-Immersion, ArF, KrF, an electron beam, ion-beam, or neutron beam, and wherein the forming of the device resist pattern on the object to be patterned by using the resist comprises:
coating the resist on the object to be patterned;
exposing the resist by EUV, ArF-Immersion, ArF, KrF, an electron beam, ion-beam, or neutron beam;
performing post-exposure bake (PEB) after exposing the resist; and
completing the device resist pattern by developing the resist.

2. The lithography method of claim 1, wherein the estimating of the shape of the virtual resist pattern comprises:
selecting a material composition of the resist;
modeling a unit lattice cell of the resist by using a molecular scale simulation;
calculating, by using a quantum scale simulation, a dissociation energy curve of a photo-acid generator (PAG) of the resist and a reaction speed constant of deprotection in an exposed domain of a polymer composition forming a component of the resist;
simulating acid diffusion within the resist and the deprotection of a first polymer chain having the polymer composition of the resist by using a continuum scale simulation;
calculating solubility of the first polymer chain in the unit lattice cell in accordance with the deprotection;
obtaining the virtual resist pattern by removing the first polymer chain from the unit lattice cell in response to determining the first polymer chain is soluble based on calculating solubility of the first polymer chain; and
estimating the shape of the virtual resist pattern.

3. The lithography method of claim 2,
wherein, the selecting of the material composition of the resist includes selecting at least one of a molecular weight of the polymer chain, a kind of a protection group, a kind of PAG molecules, a mixing ratio of PAG molecules.

4. The lithography method of claim 2,
wherein the molecular scale simulation is a molecular dynamics (MD) simulation, and
wherein, in the modeling of the unit lattice cell of the resist, the unit lattice cell is modeled at a molecular level including mixing polymer chains with PAG within the unit lattice cell.

5. The lithography method of claim 4, wherein a dissociation reaction of the PAG is simulated by using the dissociation energy curve to obtain an acid concentration profile and relative position of acid with respect to a protection group.

6. The lithography method of claim 2,
wherein the quantum scale simulation is a density function theory (DFT) simulation, and
wherein, in the calculating of the dissociation energy curve of the PAG and the reaction speed constant of the deprotection in the exposed domain,
the dissociation energy curve in accordance with secondary electron absorption that occurs in exposure is calculated, and
the reaction speed constant is calculated from energy and a vibrational frequency of main molecules in accordance with a transition state theory.

7. The lithography method of claim 6, wherein the dissociation energy curve is applied to a force field between PAG cations and anions in the exposed domain of the unit lattice cell in the modeling of the unit lattice cell of the resist and is reproduced by a dissociation reaction of the PAG in the exposed domain.

8. The lithography method of claim 2,
wherein the continuum scale simulation is a finite difference method (FDM) simulation, and
wherein, in the simulating of the acid diffusion and the deprotection, an acid concentration profile is modeled by the continuum scale simulation and a position of a plurality of protection groups of the first polymer chain in the unit lattice cell is also modeled by the continuum scale simulation.

9. The lithography method of claim 8, wherein
the acid concentration is diffused in a continuum cell in accordance with the following EQUATION (1) and changes a protection ratio value in accordance with the following EQUATION (2), $$\frac{\partial f_{acid}}{\partial t} = \nabla \cdot (D_{acid} \nabla f_{acid}) \quad \text{EQUATION (1)}$$

$$\frac{dR_{pro}}{dt} = -k f_{acid} R_{pro} \quad \text{EQUATION (2)}$$

wherein, $f_{acid}$ represents an acid concentration, $D_{acid}$ represents an acid diffusion coefficient, and $R_{pro}$ and k respectively represent the protection ratio value of an individual protection group and a deprotection reaction speed constant, time iteration is performed by applying an explicit method, and a boundary condition at which inflow and outflow of acid do not occur on the outermost surface of the continuum cell is applied, and
the protection ratio value is reduced from 1 during a deprotection reaction.

10. The lithography method of claim 2,
wherein, in the calculating of the solubility of the first polymer chain in the unit lattice cell in accordance with the deprotection, a protection ratio of the first polymer chain is calculated by obtaining an arithmetic mean value for the protection ratio values of protection groups of the polymer chain, and
wherein it is determined that the polymer chain is soluble to a development solvent when the protection ratio of the polymer chain is not greater than a reference value.

11. The lithography method of claim 2,
wherein, in the estimating of the shape of the virtual resist pattern, patterning performance of the selected resist is quantified by calculating at least one value of a critical dimension (CD), line edge roughness (LER), line width roughness (LWR), and local CD uniformity (LCDU) of the virtual resist pattern.

12. The lithography method of claim 1, further comprising, after the forming of the device resist pattern on the object to be patterned, forming a pattern on the object to be patterned by using the device resist pattern as an etching mask.

13. A method of manufacturing a semiconductor device, the method comprising: estimating a shape of a virtual resist pattern based on a multi-scale simulation for a selected resist, wherein the selected resist models a resist using one of resist materials;
forming a test resist pattern by performing exposure on a layer formed of the selected resist;
comparing the test resist pattern with the virtual resist pattern;

forming a device resist pattern formed of the selected resist on an object to be patterned when an error between the test resist pattern and the virtual resist pattern is in an allowable range;

forming a pattern on the object to be patterned by using the device resist pattern as an etching mask; and performing one or more subsequent semiconductor processes on the object to be patterned to form the semiconductor device, wherein the estimating of the shape of the virtual resist pattern comprises:

selecting a material composition of the resist;

modeling a unit lattice cell of the resist by using a molecular scale simulation;

calculating, by using a quantum scale simulation, a dissociation energy curve of a photo-acid generator (PAG) of the resist and a reaction speed constant of deprotection in an exposed domain of a polymer composition forming a component of the resist;

simulating acid diffusion within the resist and the deprotection of a first polymer chain having the polymer composition of the resist by using a continuum scale simulation;

calculating solubility of the first polymer chain in the unit lattice cell in accordance with the deprotection;

obtaining the virtual resist pattern by removing the first polymer chain from the unit lattice cell in response to determining the first polymer chain is soluble based on calculating solubility of the first polymer chain; and estimating the shape of the virtual resist pattern.

14. The method of claim 13, wherein the resist is for EUV, ArF-Immersion, ArF, KrF, an electron beam, ion-beam, or neutron beam, wherein the molecular scale simulation is an MD simulation, wherein the quantum scale simulation is a DFT simulation, wherein the continuum scale simulation is an FDM simulation, and wherein, in the estimating of the shape of the virtual resist pattern, at least one value of a critical dimension (CD), line edge roughness (LER), line width of the virtual resist pattern is calculated and patterning performance of the selected resist is quantified.

15. The method of claim 13, wherein, the selecting of the material composition of the resist includes selecting at least one of a molecular weight of the polymer chain, a kind of a protection group, a kind of PAG molecule and a mixing ratio of PAG molecules, and wherein, in the modeling of the unit lattice cell of the resist, the unit lattice cell is modeled at a molecular level by a mixture of materials including the first polymer chain and the PAG.

* * * * *

UNITED STATES PATENT AND TRADEMARK OFFICE
CERTIFICATE OF CORRECTION

PATENT NO. : 11,493,850 B2
APPLICATION NO. : 16/593149
DATED : November 8, 2022
INVENTOR(S) : Byunghoon Lee et al.

Page 1 of 1

It is certified that error appears in the above-identified patent and that said Letters Patent is hereby corrected as shown below:

On the Title Page

Item (73) Assignees should read as:
SAMSUNG ELECTRONICS CO., LTD., Suwon-si (KR)
Seoul National University R&DB Foundation, Seoul (KR)

Signed and Sealed this
Twenty-seventh Day of February, 2024

Katherine Kelly Vidal
*Director of the United States Patent and Trademark Office*